(12) United States Patent
Araki et al.

(10) Patent No.: US 8,015,371 B2
(45) Date of Patent: Sep. 6, 2011

(54) STORAGE APPARATUS AND METHOD OF MANAGING DATA STORAGE AREA

(75) Inventors: Akihiko Araki, Yokohama (JP); Yoshiki Kano, Yokohama (JP); Sadahiro Sugimoto, Yokohama (JP); Yusuke Nonaka, Sagamihara (JP)

(73) Assignee: Hitachi, Ltd., Tokyo (JP)

( * ) Notice: Subject to any disclaimer, the term of this patent is extended or adjusted under 35 U.S.C. 154(b) by 439 days.

(21) Appl. No.: 12/338,138

(22) Filed: Dec. 18, 2008

(65) Prior Publication Data

US 2010/0115183 A1    May 6, 2010

(30) Foreign Application Priority Data

Oct. 30, 2008  (JP) ................ 2008-279661

(51) Int. Cl.
*G06F 12/00* (2006.01)
(52) U.S. Cl. ...................................................... 711/156
(58) Field of Classification Search .................. None
See application file for complete search history.

(56) References Cited

U.S. PATENT DOCUMENTS

2007/0285980 A1  12/2007  Shimizu et al.

FOREIGN PATENT DOCUMENTS

JP  2007-305210  11/2007

*Primary Examiner* — Brian R Peugh
(74) *Attorney, Agent, or Firm* — Antonelli, Terry, Stout & Kraus, LLP.

(57) ABSTRACT

Disclosed is a storage apparatus that extends endurance and reduces bit cost. A storage apparatus includes a controller and a semiconductor storage media that has a plurality of storage devices. The plurality of storage devices include a first storage device and a second storage device having an upper limit of an erase count of data smaller than that of the first storage device. Area conversion information includes correspondence of a first address to be specified as a data storage destination and a second address of an area in which data is to be stored. A rewrite frequency of stored data is recorded for each area. The controller selects an area corresponding to the first address, determines whether or not the rewrite frequency of the selected area is equal to or larger than a first threshold value, when the rewrite frequency is equal to or larger than the threshold value, selects an area to be provided by the first storage device, and when the rewrite frequency is smaller than the threshold value, selects an area to be provided by the second storage device and maps the address of the selected area to the first address.

15 Claims, 15 Drawing Sheets

STORAGE APPARATUS AND METHOD OF MANAGING DATA STORAGE AREA

CROSS REFERENCES TO RELATED APPLICATIONS

This application relates to and claims priority from Japanese Patent Application No. 2008-279661, filed on Oct. 30, 2008, the entire disclosure of which is incorporated herein by reference.

BACKGROUND OF THE INVENTION

1. Field of the Invention

The present invention relates to a storage apparatus having a semiconductor storage media, and in particular, to a technology for managing a data storage area.

2. Description of the Related Art

In recent years, a nonvolatile semiconductor memory, such as a flash memory, which supports high-speed access, is attracting attention. A flash memory which has come into wide use is called a NAND flash memory, and is divided into MLC (Multiple Level Cell) and SLC (Single Level Cell) according to the characteristic of the storage device. The MLC has a storage capacity of two or more bits per memory cell, and has features of low bit cost, low performance, and short endurance. The SLC has a storage capacity of one bit per memory cell, and has features of high bit cost, high performance, and long endurance.

The flash memory includes a plurality of flash memory chips. Each of the flash memory chips has a plurality of memory blocks (hereinafter, referred to as "block") for storing data. The flash memory has a feature that data is erased in a block unit. In the flash memory, a bit can only be changed in one direction ($1 \rightarrow 0$), and in order to change a bit in the other direction, it is necessary to erase a block once and to change all the blocks to 1. However, an erase count of a block in the flash memory has an upper limit (100000 in the SLC and 10000 in the MLC). In a block (hereinafter, referred to as "worn-out block") in which the erase count reaches the upper limit, an error may occur during the read and write operations.

For this reason, when a flash memory as a substitute for a hard disk is coupled to a computer, only some of blocks may reach the upper limit of the erase count due to a bias of a write frequency for each block, and may be disabled. In order to solve this problem, JP-A-2007-305210 discloses a technology that stores data, which is predicted to have a high rewrite frequency, in an SLC area in advance, and stores data, which is predicted to have a low rewrite frequency, in an MLC area in advance.

The SSD (Solid State Drive) as a storage apparatus using a flash memory includes an SSD having a flash memory of one type of SLC or MLC and an SSD having flash memories of SLC and MLC. In an SSD having SLC and MLC, like the technology disclosed in JP-A-2007-305210, the storage destination of data is defined depending on the contents or the characteristics of data to be stored. The SSD has substitute blocks as a substitute area in advance therein. When all the substitute blocks are used up, the SSD becomes unwritable, and the SSD is worn out.

When the SSD is mounted as a storage media of a storage system, the following three modes may be considered depending on the type of the flash memory forming the SSD: one of an SSD having an SLC and an SSD having an MLC is used; an SSD having an SLC and an SSD having an MLC are used together; and an SSD having an SLC and an MLC is used. When such an SSD is mounted on a storage system, a different SSD is allocated as a substitute for an SSD (hereinafter, referred to as "worn-out SSD") which becomes unwritable because all the substitute blocks are used up.

SUMMARY OF THE INVENTION

According to the technology disclosed in JP-A-2007-305210, a data storage area is sorted into the SLC or the MLC depending on a rewrite frequency of data, thereby preventing data from being biasedly written in a specific memory block.

According to the technology disclosed in JP-A-2007-305210, however, data to be allocated to the SLC and the MLC is fixed in advance, and the type of the substitute block is fixed. For this reason, when the rewrite frequency of data stored in the MLC becomes high, the MLC is expected to be rapidly worn out. Accordingly, the substitute blocks of the MLC are likely to be drained, and the endurance of the SSD decreases. The decrease in the endurance of the SSD causes an increase in substitution frequency of the SSD, and as a result, bit cost increases. When the rewrite frequency of data stored in the SLC becomes low, even data having a low rewrite frequency is continuously stored in the SLC of high bit cost, and as a result, bit cost increases.

If an SSD is mounted on a known storage system, when a different SSD as a substitute for a worn-out SSD is allocated, the type of the SSD is selected without taking an access status to the worn-out SSD. For example, when the rewrite frequency of data stored in the SLC decreases, although bit cost can be decreased when data is stored in the MLC, data is continuously stored in the SLC. For this reason, bit cost increases. When the rewrite frequency of data stored in the MLC increases, although the endurance can be extended when data is stored in the SLC, data is continuously stored in the MLC. For this reason, the endurance of the MLC is shortened. As a result, the endurance of the entire SSD is shortened.

When an SSD having an SLC and an MLC together is mounted on a storage system, when the substitute blocks of one of the SLC and the MLC are used up and the SSD is worn out, the SSD should be substituted with a different SSD, and a sufficient number of blocks of the other one of the SLC and the MLC cannot be used. For example, when no MLC area remains in the SSD, the SSD having a sufficient number of SLC areas has to be substituted whole, and the SLC areas cannot be used. As described above, when an SSD is substituted in a state where a sufficient number of blocks remain in the SSD, it may be impossible to optimize bit cost.

According to an embodiment of the invention, a storage apparatus includes a semiconductor storage media that has a plurality of storage devices, and a controller that is coupled to the semiconductor storage media. Each of the storage devices has an upper limit of an erase count of data stored therein. The plurality of storage devices include a first storage device and a second storage device having an upper limit smaller than that of the first storage device. The controller includes an interface, a processor that is coupled to the interface, and a memory that is coupled to the processor. The memory stores storage media management information that is used to manage the semiconductor storage media. The storage media management information includes area conversion information including the correspondence of a first address to be specified as a storage destination of data and a second address of an area where data is stored, and a rewrite frequency of stored data is recorded for each area. The controller selects an area corresponding to the first address, acquires the rewrite frequency of the selected area from the storage media management information, determines whether or not the acquired rewrite frequency is equal to or larger than a first threshold value, when the acquired rewrite frequency is equal to or larger than the first threshold value, selects a first area to be provided by the first storage device, when the acquired rewrite frequency is smaller than the first threshold value, selects a second area to be provided by the second storage device, and sets a second address of the selected first area or second area to the second address corresponding to the first address, to thereby update the area conversion information.

According to the embodiment of the invention, in a storage apparatus having a plurality of types of storage devices (flash memories), endurance of the storage apparatus can be extended and bit cost can be reduced.

DETAILED DESCRIPTION OF THE INVENTION

Embodiments of the invention will now be described with reference to the drawings.

First Embodiment

A first embodiment will now be described with reference to FIGS. 1 to 6.

Figure 1:
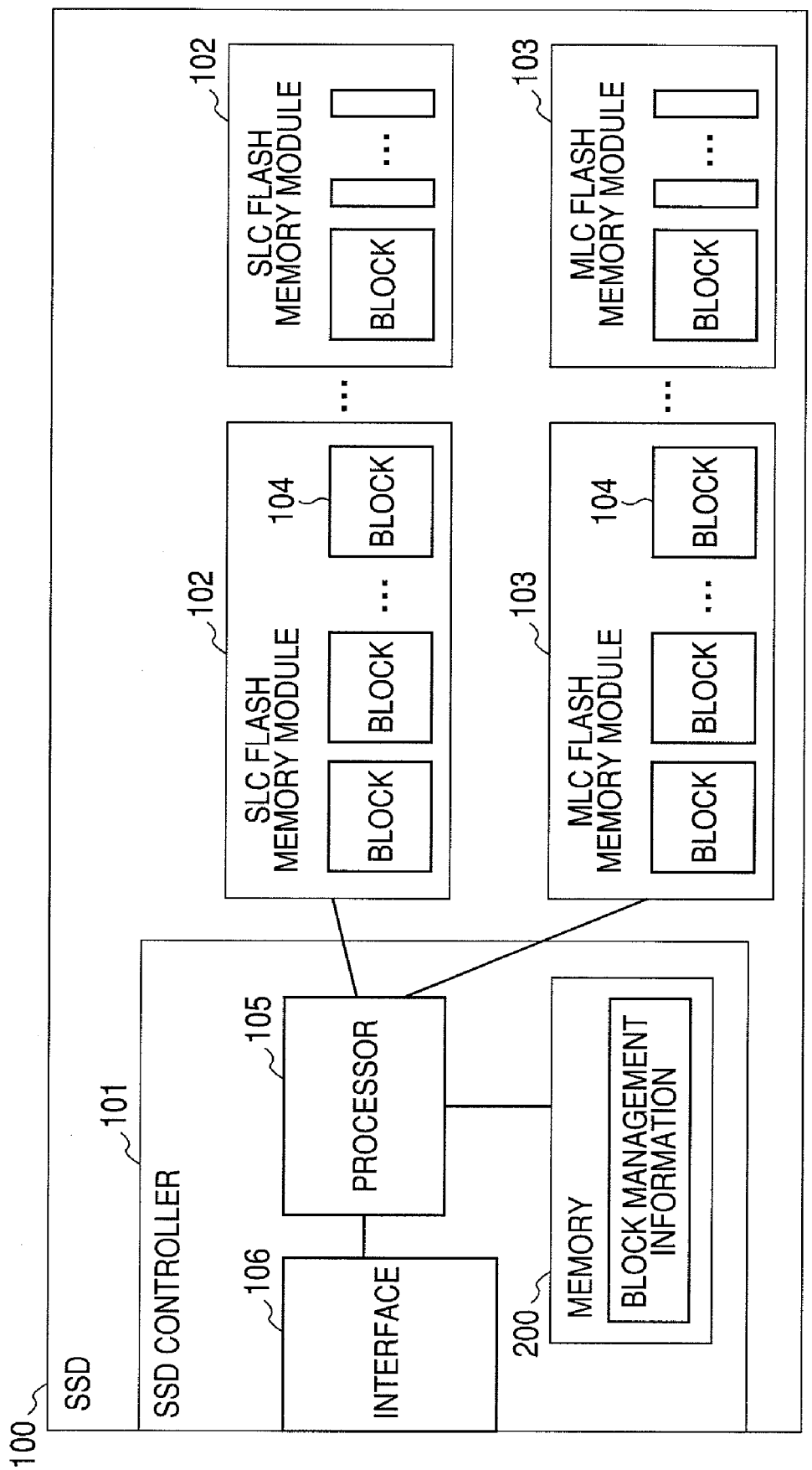
FIG. 1 is a block diagram showing an example of an SSD as a storage apparatus using a flash memory according to a first embodiment of the invention.

FIG. 1 is a block diagram showing an example of an SSD 100 as a storage apparatus using a flash memory according to the first embodiment of the invention.

The SSD 100 includes an SSD controller 101, an SLC flash memory module 102, and an MLC flash memory module 103.

The SSD controller 101 controls the entire SSD 100. The SSD controller 101 has a processor 105, an interface 106, and block management information 200. The processor 105 controls data input/output. The interface 106 receives a data input/output request. The block management information 200 stores information for managing blocks 104.

The SLC flash memory module 102 and the MLC flash memory module 103 are coupled to the SSD controller 101. The flash memory module is a memory module in which a plurality of flash memory chips are mounted on a printed board. The flash memory module has a plurality of blocks 104 that store data therein.

Figure 2:
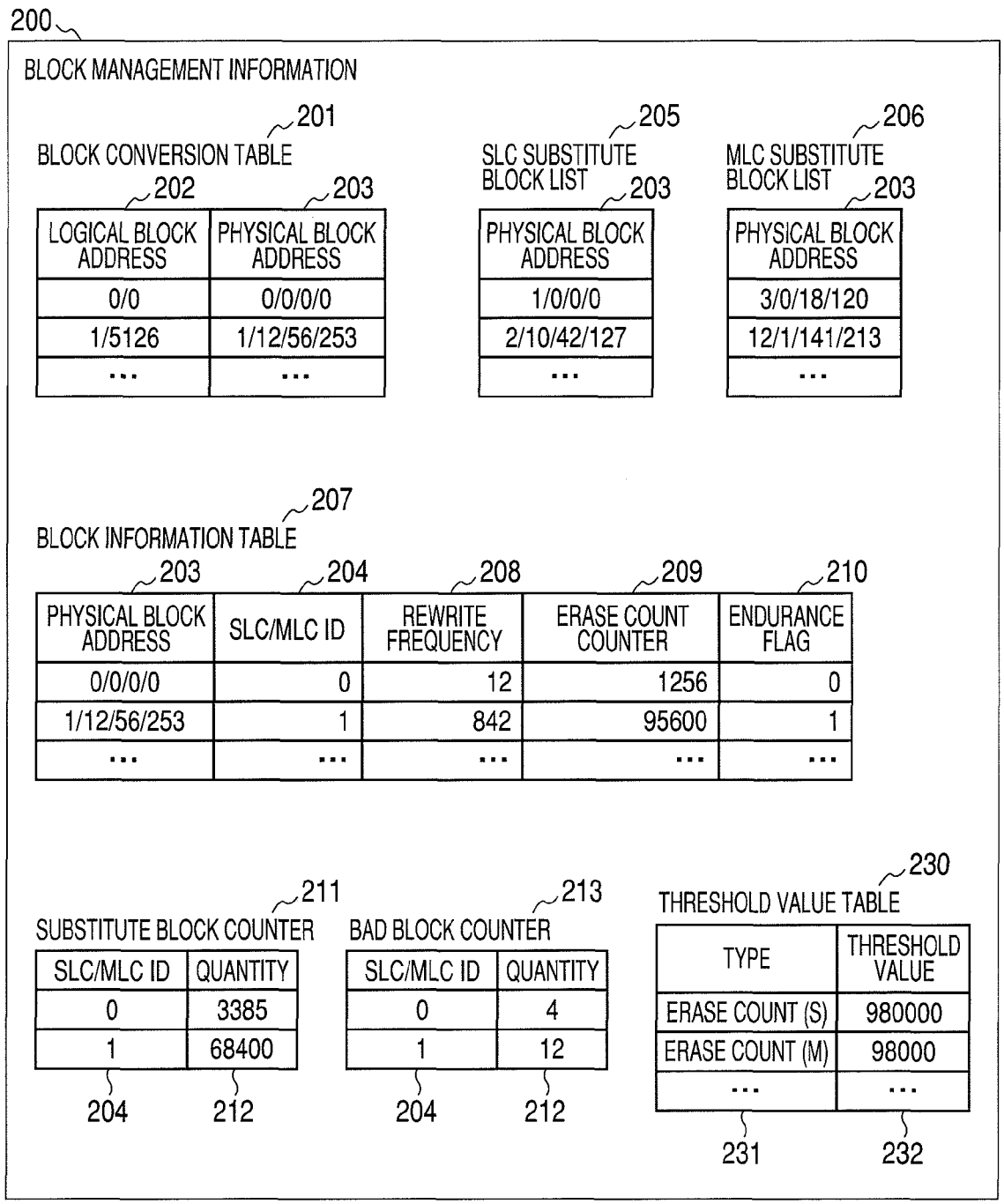
FIG. 2 is a diagram showing an example of block management information according to the first embodiment of the invention.

FIG. 2 is a diagram showing an example of the block management information 200 according to the first embodiment of the invention.

The block management information 200 includes a block conversion table 201, an SLC substitute block list 205, an MLC substitute block list 206, a block information table 207, a substitute block counter 211, a bad block counter 213, and a threshold value table 230.

The block conversion table 201 is a mapping table of logical block address 202 and physical block address 203. The logical block address 202 indicates the location of a block in a logical address space. The physical block address 203 indicates the location of a block of a physical flash memory chip allocated with the logical block address 202.

The SLC substitute block list 205 is a list of physical block addresses 203 of SLC blocks, to which no storage area is allocated but a storage area is allocatable, from among blocks in the SSD.

The MLC substitute block list 206 is a list of physical block addresses 203 of MLC blocks, to which no storage area is allocated but a storage area is allocatable, from among blocks in the SSD.

The block information table 207 is a table that manages information, such as a rewrite frequency, an erase count, and whether or not a block is a worn-out block, for each allocated block. The block information table 207 includes physical block address 203, SLC/MLC ID 204, rewrite frequency 208, erase count counter 209, and endurance flag 210.

The SLC/MLC ID 204 is an identifier indicating whether the type of a memory module allocated with a block corresponding to the physical block address 203 is SLC or MLC.

The rewrite frequency 208 is an indicator which is used to determine whether the type of a substitute block to be allocated as a substitute when a block becomes a worn-out block is SLC or MLC. For example, a cycle of rewriting during a predetermined period may be used. In addition, a time at which a corresponding block is last substituted may be stored, and a time elapsed from a last substitution processing may be used as the rewrite frequency.

The erase count counter 209 is the number of erase count for each block, and is incremented each time a block is erased. The erase count counter 209 is an indicator which is used to determine whether or not a block is worn out.

The endurance flag 210 is information indicating whether or not a block is a worn-out block. For example, the endurance flag is set to "0" in an initial state, and when the erase count exceeds a reference value, it is set to "1". A block with the endurance flag 210 set to "1" becomes a worn-out block.

The substitute block counter 211 indicates the number of remaining substitute blocks. The substitute block counter 211 includes SLC/MLC ID 204 and the number 212 of substitute blocks. The substitute block counter 211 stores the number of substitute blocks for SLC or MLC.

The bad block counter 213 stores the number of blocks which are unusable due to endurance or physical failure. The bad block counter 213 includes SLC/MLC ID 204 and the number 212 of substitute blocks. The bad block counter 213 stores the number of bad blocks for each of the SLC and the MLC. Before the system operates, the number of initial bad blocks in a flash memory is acquired and set as an initial value.

The threshold value table 230 stores a threshold value which is used to determine whether or not to substitute a block and a threshold value which is used to determine the type of a block as a substitute.

A substitute block selection procedure according to the first embodiment of the invention will be described. In the first embodiment, when data is written, it is determined on the basis of an erase count of data whether or not to substitute a target block in which data is to be written. In addition, it is determined the type of a block as a substitute on the basis of the write frequency of the target block in which data is to be written.

According to the first embodiment of the invention, a block substitution processing is executed when it is determined that a block has to be erased, but the invention is not limited thereto. The block substitution processing may be executed in various ways. For example, the block substitution processing may be executed periodically.

First, a writing processing procedure with respect to a flash memory will be described.

Figure 3:
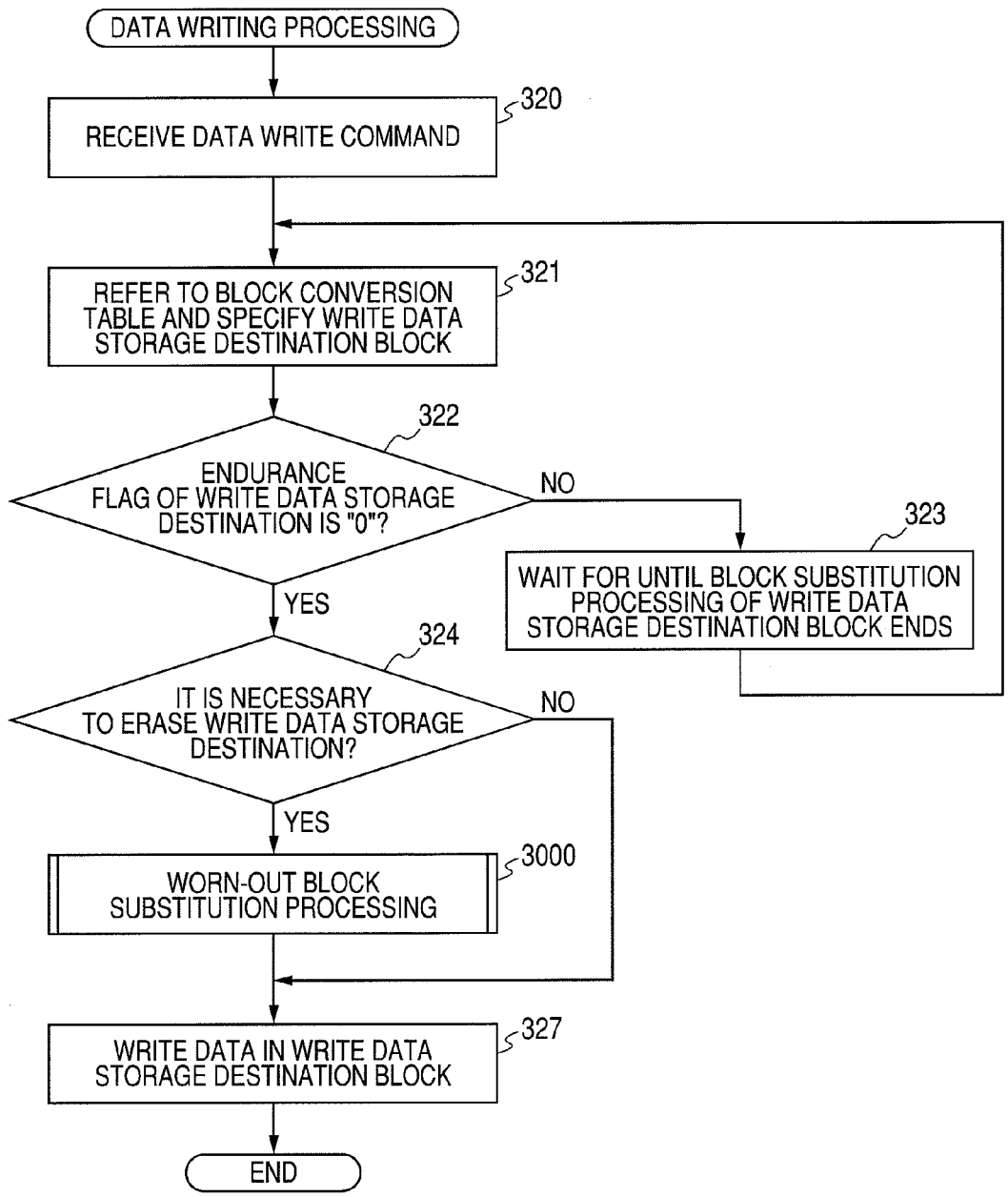
FIG. 3 is a flowchart showing an example of a writing processing procedure according to the first embodiment of the invention.

FIG. 3 is a flowchart showing an example of a writing processing procedure according to the first embodiment of the invention.

If a write request (write command) is received (Step 320), the processor 105 of the SSD controller 101 refers to the block conversion table 201, acquires the physical block address 203 corresponding to the logical block address 202 of a write destination in the write command, and specifies a write data storage destination block (Step 321).

The processor 105 of the SSD controller 101 refers to the endurance flag 210 in the block information table 207 corresponding to the write data storage destination block, and specifies whether or not the value of the endurance flag 210 is "0" (OFF) (Step 322).

When the endurance flag 210 is not "0" (OFF), that is, when the endurance flag 210 is "1" (ON) ("No" in Step 322), the write data storage destination block is a worn-out block. Thus, the processor 105 of the SSD controller 101 can recognize that the block substitution processing is being executed. Therefore, the processor 105 waits for until the block substitution processing ends, and the value of physical block address 203 in the block conversion table 201 is changed (Step 323). Next, the process returns to Step 321.

When the endurance flag 210 is "0" (OFF) ("Yes" in Step 322), the write data storage destination block is not a worn-out block, and thus the processor 105 of the SSD controller 101 can store data in the corresponding block. Next, the processor 105 of the SSD controller 101 determines whether or not the write data storage destination block has to be erased once (Step 324). When the write data storage destination block does not have to be erased once ("No" in Step 324), that is, when data can be stored in the write data storage destination block as it is, data is written in the write data storage destination block (Step 327). Thus, this processing ends.

When the write data storage destination block has to be erased once ("Yes" in Step 324), the processor 105 of the SSD controller 101 executes a worn-out block substitution processing with respect to the write data storage destination block (Step 3000). The details of the worn-out block substitution processing will be described below with reference to FIG. 4.

If the worn-out block substitution processing is completed, processor 105 of the SSD controller 101 writes data in the write data storage destination block (Step 327). Thus, this processing ends.

Figure 4:
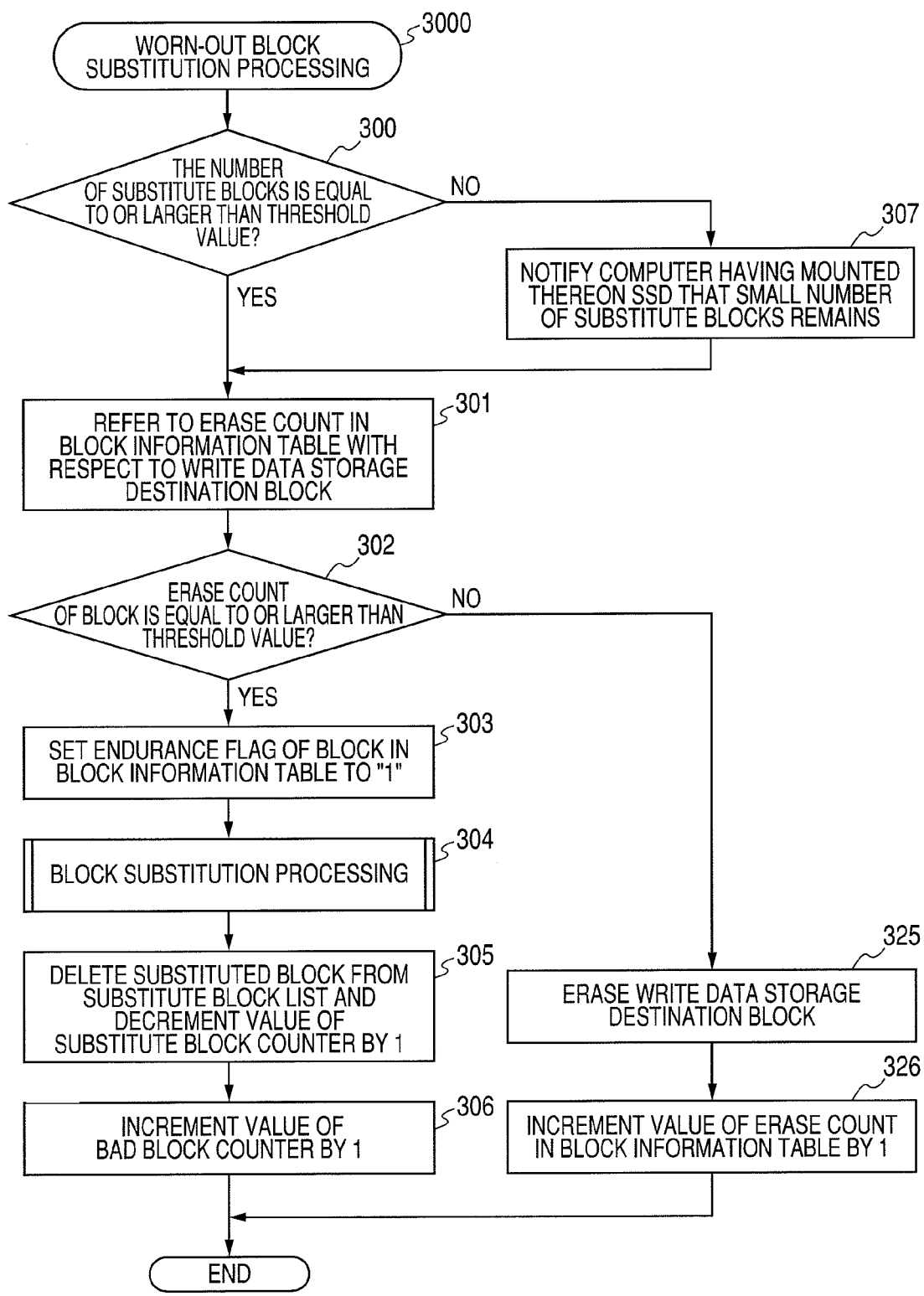
FIG. 4 is a flowchart showing an example of a worn-out block substitution processing procedure according to the first embodiment of the invention.

FIG. 4 is a flowchart showing an example of a worn-out block substitution processing according to the first embodiment of the invention.

When a block is erased, the processor 105 of the SSD controller 101 refers to the substitute block counter 211, and determines whether or not the number 212 of substitute blocks is larger than a prescribed threshold value (Step 300). The threshold value is preferably set such that it is possible to determine that the substitute blocks of the SLC and the substitute blocks of the MLC are equal to or larger than a predetermined number of blocks. The threshold value needs to be set in the threshold value table 230 in advance, but it may be reset depending on the status of the SSD 100.

When the number 212 of substitute blocks is smaller than the prescribed threshold value ("No" in Step 300), since the SSD 100 is close to an expected endurance, the processor 105 of the SSD controller 101 notifies an initiator coupled to the SSD 100 or a computer having the initiator that a small number of substitute blocks remains (Step 307).

When the number 212 of substitute blocks is equal to or larger than the prescribed threshold value ("Yes" in Step 300), or when Step 307 ends, the processor 105 of the SSD controller 101 determines whether or not an erased block is a worn-out block.

The processor 105 of the SSD controller 101 first refers to the erase count counter 209 corresponding to the erased block in the block information table 207 (Step 301). Next, it is determined whether or not the erase count counter 209 of the erased block is equal to or larger than a prescribed threshold value, that is, the erased block is a worn-out block (Step 302).

When the erase count counter 209 of the erased block is smaller than the prescribed threshold value, that is, when the erased block is not a worn-out block ("No" in Step 302), the processor 105 of the SSD controller 101 erases a storage destination block in which data is to be written (Step 325). Next, the value of the erase count counter 209 of the block information table 207 is incremented by 1 (Step 326), and then this processing ends.

When the value of the erase count counter 209 of the erased block is equal to or larger than the threshold value ("Yes" in Step 302), the processor 105 of the SSD controller 101 sets the endurance flag 210 of the block information table 207 to "1" (ON) (Step 303). Next, a block substitution processing for allocating a block as a substitute for a worn-out block is executed (Step 304). The details of the block substitution processing will be described below with reference to FIG. 5.

If the block substitution processing (Step 304) is completed, the processor 105 of the SSD controller 101 deletes the physical block address 203 of the substituted block from the SLC substitute block list 205 or the MLC substitute block list 206, and decrements the quantity 212 of the substitute block counter 211 by 1 (Step 305).

The processor 105 of the SSD controller 101 increments the quantity 212 of the bad block counter 213 corresponding to the SLC/MLC ID 204 with respect to the worn-out block by 1 (Step 306).

Figure 5:
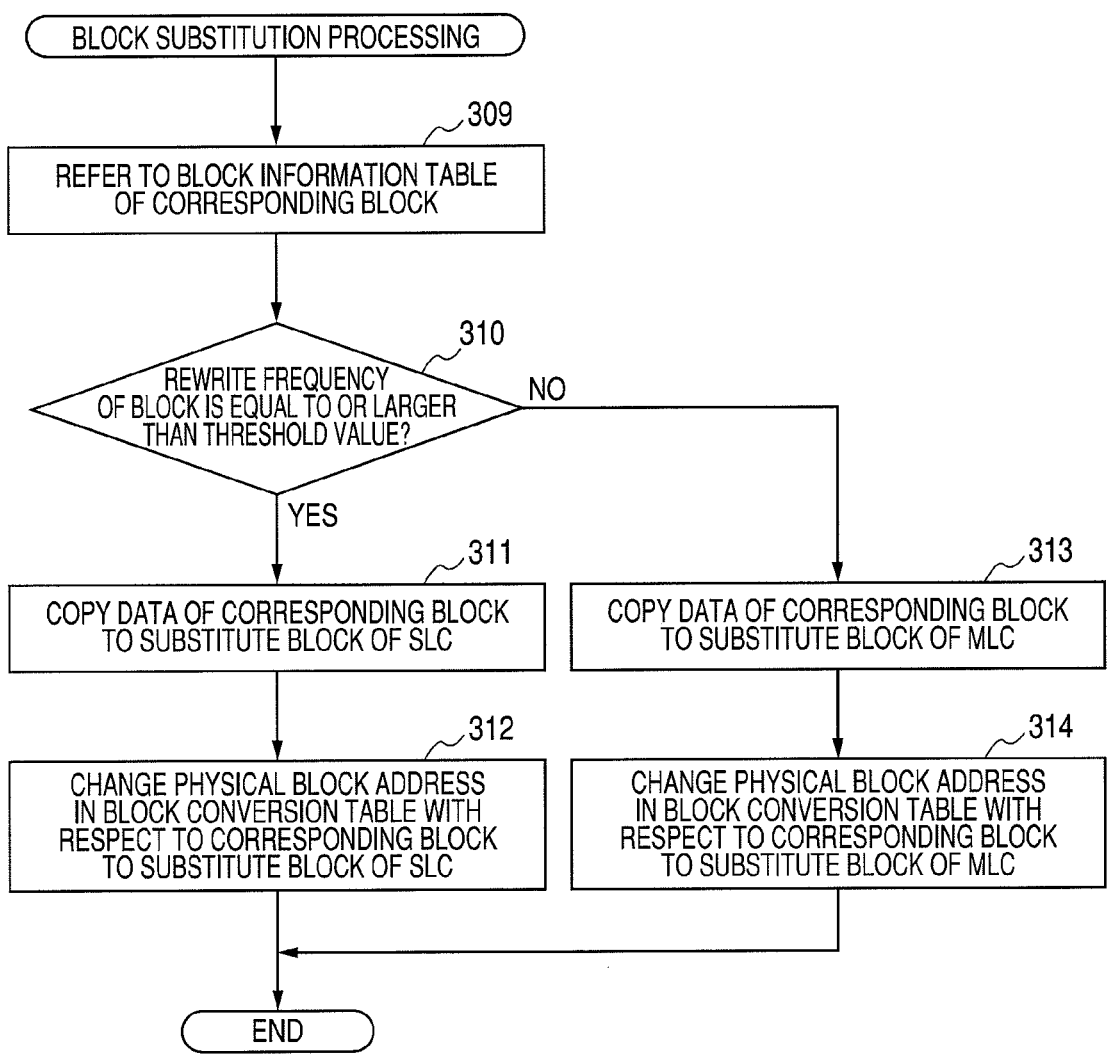
FIG. 5 is a flowchart showing an example of a block substitution processing procedure according to the first embodiment of the invention.

FIG. 5 is a flowchart showing an example of a block substitution processing procedure according to the first embodiment of the invention.

The processor 105 of the SSD controller 101 refers to the rewrite frequency 208 in the block information table 207 with respect to the worn-out block (Step 309), and determines whether or not the rewrite frequency 208 is equal to or larger than a prescribed threshold value (Step 310).

In Step 310, although the rewrite frequency 208 is used as a selection criterion of the type of the substitute block, for example, the type of the substitute block may be selected on the basis of a ratio of the number of substitute blocks of the SLC and the number of substitute blocks of the MLC to be acquired from the substitute block counter 211, or on the basis of a ratio of the number of bad blocks of the SLC and the number of bad blocks of the MLC to be acquired from the bad block counter 213.

In the first embodiment of the invention, when the rewrite frequency 208 is equal to or larger than the threshold value, it can be determined that data having a high rewrite frequency is stored in the worn-out block. Therefore, allocation of an SLC having a high upper limit of an erase ensures extension of endurance. When the rewrite frequency 208 is smaller than the threshold value, it can be determined that data having a low rewrite frequency is stored in the worn-out block. Therefore, allocation of an MLC having a low upper limit of an erase count but low bit cost ensures reduction in bit cost.

When data having a high rewrite frequency is stored in the worn-out block ("Yes" in Step 310), the processor 105 of the SSD controller 101 selects an SLC as a substitute block. Next, data stored in the worn-out block is copied to the selected substitute block of the SLC (Step 311). If data is copied from the worn-out block to the substitute block, the physical block address 203 in the block conversion table 201 with respect to the worn-out block is changed to the physical block address 203 of the substitute block (Step 312).

Similarly, when data having a low rewrite frequency is stored in the worn-out block ("No" in Step 310), the processor 105 of the SSD controller 101 selects an MLC as a substitute block. Next, data stored in the worn-out block is copied to the selected substitute block of the MLC (Step 313). If data is copied from the worn-out block to the substitute block, the physical block address 203 in the block conversion table 201 with respect to the worn-out block is changed to the physical block address 203 of the substitute block (Step 314).

In the flowchart of FIG. 5, a case in which the substitute block of the SLC and the substitute block of the MLC are usable has been described, but when only one substitute block is usable, a usable substitute block may be forcibly selected.

Although the substitution processing procedure of the worn-out block to be executed when a block is erased has been described, when an erase frequency is high, the substitution processing of the worn-out block may be further executed, and accordingly processing overhead may increase. In such a case, if the substitution processing of the worn-out block is executed periodically, the number of processing times can be reduced, and thus the processing overhead can be reduced. When the substitution processing of the worn-out block is executed periodically, the procedure shown in FIG. 5 may be executed for all the blocks.

According to the above-described processing procedure, the storage destination block is selected on the basis of the rewrite frequency of data, and thus the endurance of the SSD 100 can be extended.

Finally, a pattern of selection of a substitute block will be described.

Figure 6:
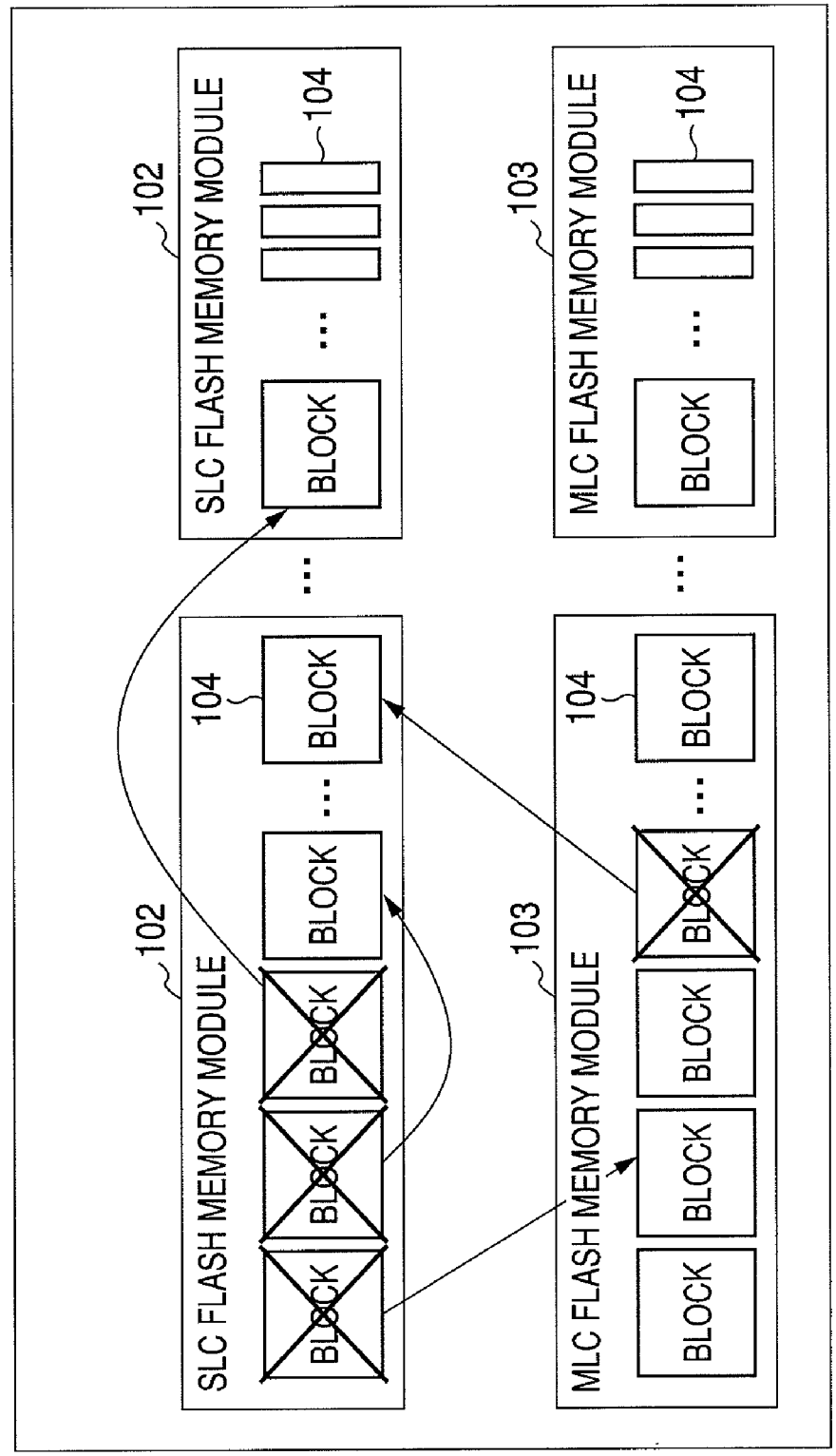
FIG. 6 is a diagram illustrating a pattern of selection of a substitute block according to the first embodiment of the invention.

FIG. 6 is a diagram illustrating a pattern of selection of a substitute block according to the first embodiment of the invention.

As the pattern of selection of a substitute block, for example, as shown in FIG. 6, a block 104 in the same flash memory module may be selected as a substitute block, or a block 104 in a different flash memory module may be selected as a substitute block.

Although a method of selecting a substitute block is not specified herein, a substitute block may be selected depending on priority. For example, a substitute block in the same flash memory module may be selected preferentially, or a substitute block in a different flash memory module may be selected preferentially.

According to the first embodiment of the invention, the type of the substitute block is selected on the basis of the rewrite frequency, and thus an increase in the endurance of the entire storage apparatus and the reduction in bit cost can be achieved. Specifically, if an SLC is used as a substitute block for a block having a high rewrite frequency, the endurance of the storage apparatus can be extended. If an MLC is used as a substitute block for a block having a low rewrite frequency, bit cost can be reduced.

Second Embodiment

According to the first embodiment of the invention, the invention is applied to the SSD including the SSD controller, but according to a second embodiment, the invention is applied to a storage system having mounted thereon a plurality of flash memory modules. In the second embodiment, instead of the SSD controller, a storage controller controls data input/output with respect to the flash memory modules.

Hereinafter, the second embodiment will be described with reference to FIGS. 7 to 10. In the second embodiment, the same contents as the first embodiment will be appropriately omitted.

Figure 7:
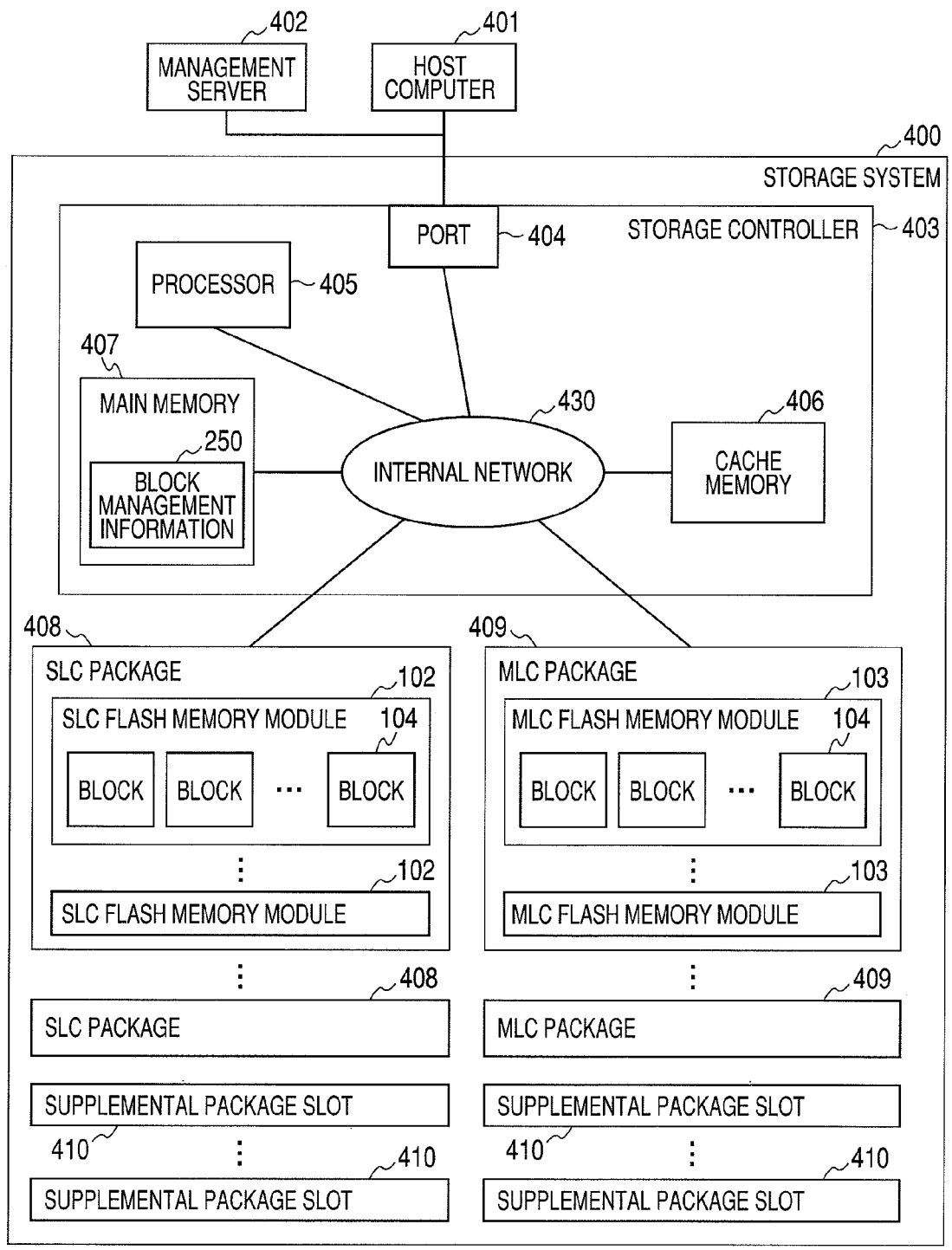
FIG. 7 is a block diagram showing an example of the configuration of a computer system according to a second embodiment of the invention.

FIG. 7 is a block diagram showing an example of the configuration of a computer system according to the second embodiment of the invention.

The computer system according to the second embodiment of the invention includes a storage system 400, a host computer 401, and a management server 402.

The storage system 400 stores data to be read and written by the host computer 401. The storage system 400 is coupled to the host computer 401 and the management server 402. The host computer 401 sends a data read/write request to the storage system 400. The management server 402 manages the storage system 400.

The storage system 400 includes a storage controller 403 and a plurality of flash memory packages. The storage controller 403 controls the entire storage system 400. The plurality of flash memory packages include SLC packages 408 and MLC packages 409. The storage controller 403 is coupled to the SLC packages 408 and the MLC packages 409.

The storage controller 403 includes a port 404, a processor 405, a cache memory 406, and a main memory 407. The port 404, the processor 405, the cache memory 406, and the main memory 407 are coupled to each other through an internal network 430.

The port 404 is coupled to the host computer 401 and the management server 402. At least one port 404 is provided in the storage controller 403. For example, one port may be coupled to the management server 402, and other ports may be coupled to the host computer 401.

The processor 405 processes a data input/output request with respect to the storage system 400 on the basis of a control program and control information stored in the main memory 407.

The cache memory 406 temporarily stores data for the sake of high-speed input/output of data stored in the flash memory packages.

The main memory 407 stores block management information 250, which is management information of blocks in the flash memory packages, and also stores a control program and control information for controlling the entire storage system 400.

Each of the SLC packages 408 includes, for example, a plurality of memory modules, a connector, a slot, and a control unit. Each memory module is a storage media in which data is stored, for example, an SLC flash memory module 102 in which a plurality of SLC flash memory chips are mounted on a printed board. The SLC flash memory module 102 is the same as the SLC flash memory module 102 in the SSD according to the first embodiment.

The connector is an interface for connection to the storage controller 403. The slot is an interface for connection of the memory module to the SLC package 408. The control unit controls access to the flash memory chips.

The MLC packages 409 are the same as the SLC packages 408, except that the type of a flash memory to be mounted on the memory module is an MLC. The memory module is the same as the MLC flash memory module 103 in the SSD according to the first embodiment.

The storage system 400 includes at least one supplemental package slot 410 that is used to add the SLC package 408 and the MLC package 409 or one of them.

When the SLC package 408 or the MLC package 409 is added to the storage system 400, the block management information 250 stored in the main memory 407 is updated by the processor 405. The details of the update will be described with reference to FIG. 8.

Figure 8:
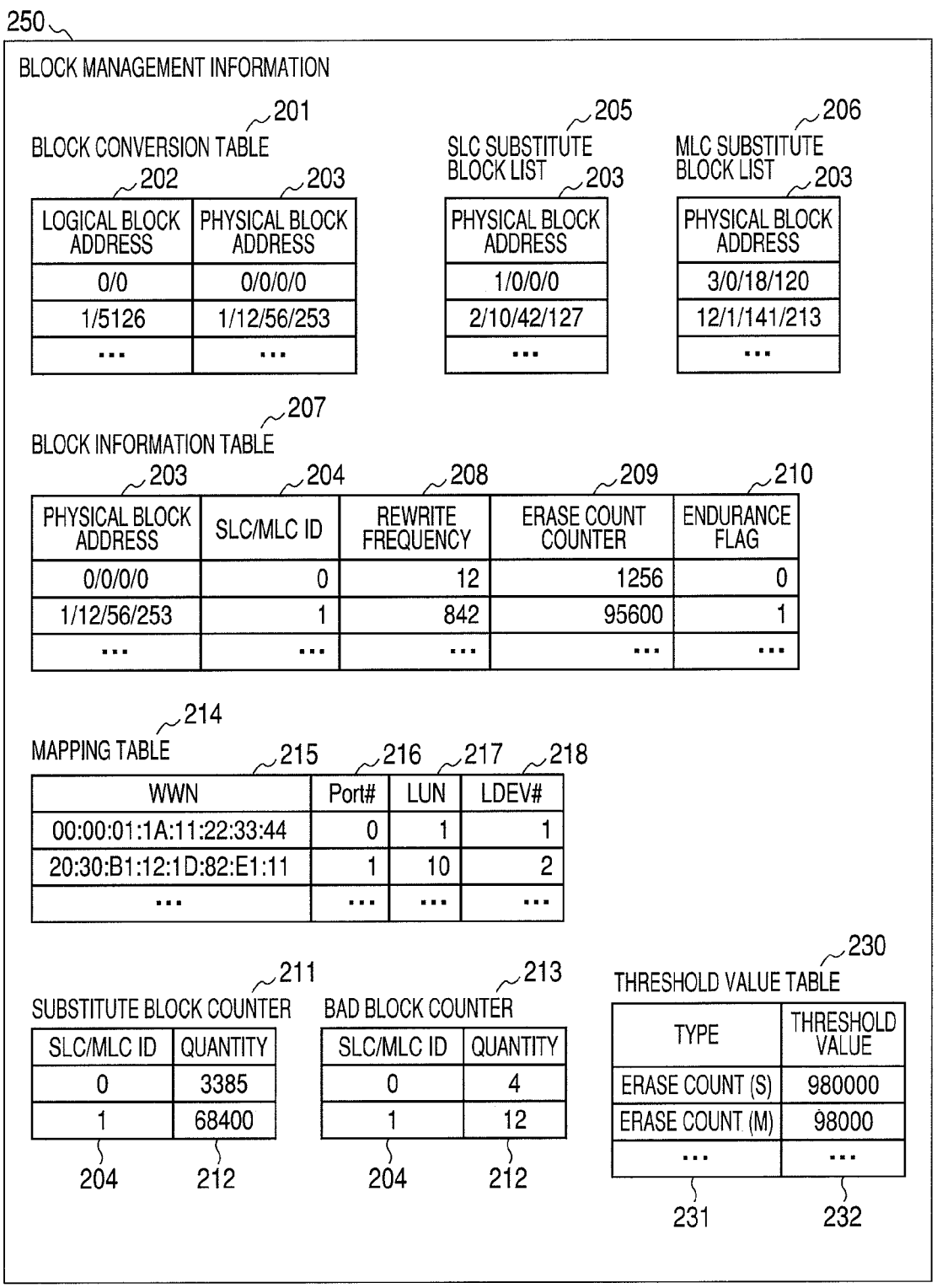
FIG. 8 is a diagram showing an example of block management information according to the second embodiment of the invention.

FIG. 8 is a diagram showing an example of the block management information 250 according to the second embodiment of the invention.

The block management information 250 includes a block conversion table 201, an SLC substitute block list 205, an MLC substitute block list 206, a block information table 207, a substitute block counter 211, a bad block counter 213, a mapping table 214, and a threshold value table 230.

The block conversion table 201, the SLC substitute block list 205, the MLC substitute block list 206, the block information table 207, the substitute block counter 211, the bad block counter 213, and the threshold value table 230 have the same configuration as those in the first embodiment.

The mapping table 214 includes WWN (World Wide Name) 215, Port# 216, LUN 217, and LDEV# 218.

The WWN 215 is a number for identifying the ports 404 which is an interface coupled to the host computer 401. The WWN 215 is an identifier to be uniquely identified by the host computer 401. The Port# 216 is a number for identifying the port 404 in the storage system 400.

The LUN 217 is a number which is used by the host computer 401 to identify a logical volume. The LDEV# 218 is a number for identifying a logical volume in the storage system 400.

As described above, when the SLC package 408 or the MLC package 409 is added to the storage system 400, the block management information 250 is updated. Specifically, when the SLC package 408 is added to the storage system 400, the physical block address 203 of a block 104 of the added SLC package 408 is added to the SLC substitute block list 205. The quantity 212 of the substitute block counter 211 is added by the number of added blocks.

Similarly, when the MLC package 409 is added to the storage system 400, the physical block address 203 of a block 104 of the added MLC package 409 is added to the MLC substitute block list 206. The quantity 212 of the substitute block counter 211 is added by the number of added blocks.

Figure 9:
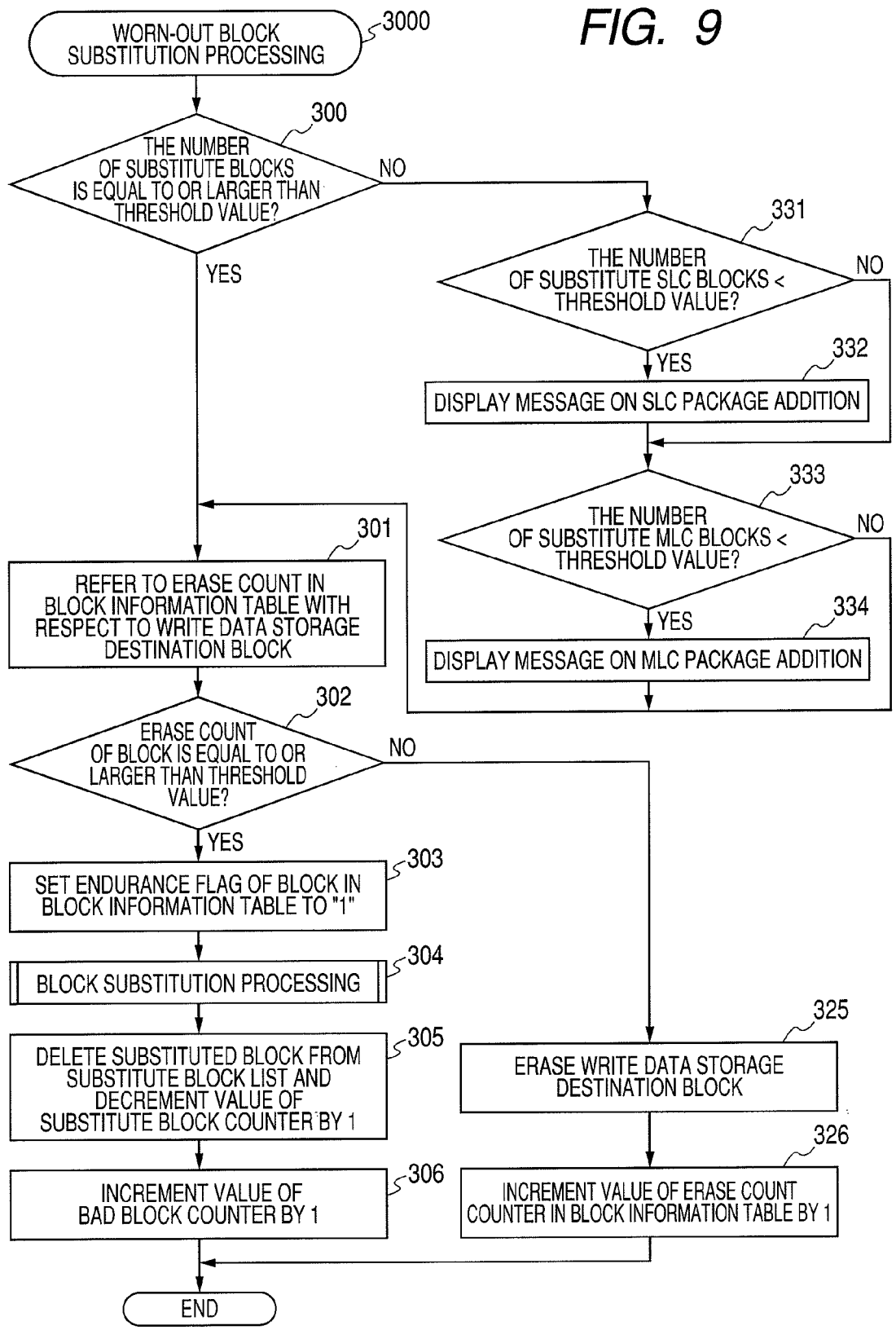
FIG. 9 is a flowchart showing an example of a worn-out block substitution processing procedure according to the second embodiment of the invention.

FIG. 9 is a flowchart showing an example of a worn-out block substitution processing procedure according to the second embodiment of the invention.

A difference from the worn-out block substitution processing according to the first embodiment of the invention shown in FIG. 3 is that, instead of the processor 105 of the SSD in the first embodiment, the processor 405 of the storage controller 403 executes the processing. In the second embodiment, a message to be displayed when a substitute block is smaller than a threshold value is also different from that in the first embodiment. Others are the same as those in the first embodiment.

Similarly to the first embodiment, if a block is erased, the processor 405 of the storage controller 403 refers to the substitute block counter 211, and determines whether or not the quantity 212 of the substitute blocks is equal to or larger than a prescribed threshold value (Step 300). The threshold value is set in the same manner as the first embodiment.

When the quantity 212 of the substitute blocks is smaller than the prescribed threshold value ("No" in Step 300), since a substitute block cannot be allocated in a short time, the processor 405 of the storage controller 403 displays a message to urge addition of an SLC package 408 or an MLC package 409. In this case, the number of substitute blocks is compared with a threshold value for each type of memory module.

The processor 405 of the storage controller 403 first determines whether or not the number of substitute SLC blocks is smaller than a threshold value (Step 331). When the number of substitute SLC blocks is smaller than the threshold value ("Yes" in Step 331), a message to urge addition of an SLC package 408 is displayed (Step 332).

Next, the processor 405 of the storage controller 403 determines whether or not the number of substitute MLC blocks is smaller than a threshold value (Step 333). When the number of substitute MLC blocks is smaller than the threshold value ("Yes" in Step 333), a message to urge addition of an MLC package 409 is displayed (Step 334).

The threshold values used in Steps 331 and 333 may have the same value or may be set depending on the type of the memory module. The messages to be displayed in Steps 332 and 334 are output to, for example, the management server 402.

When the number of substitute blocks is equal to or larger than the threshold value, or after the message is displayed, in regard to Step 301 and later, the same processing as the first embodiment shown in FIG. 3 is executed.

According to the second embodiment of the invention, an RAID can be constructed in order to increase reliability as a storage system.

Figure 10:
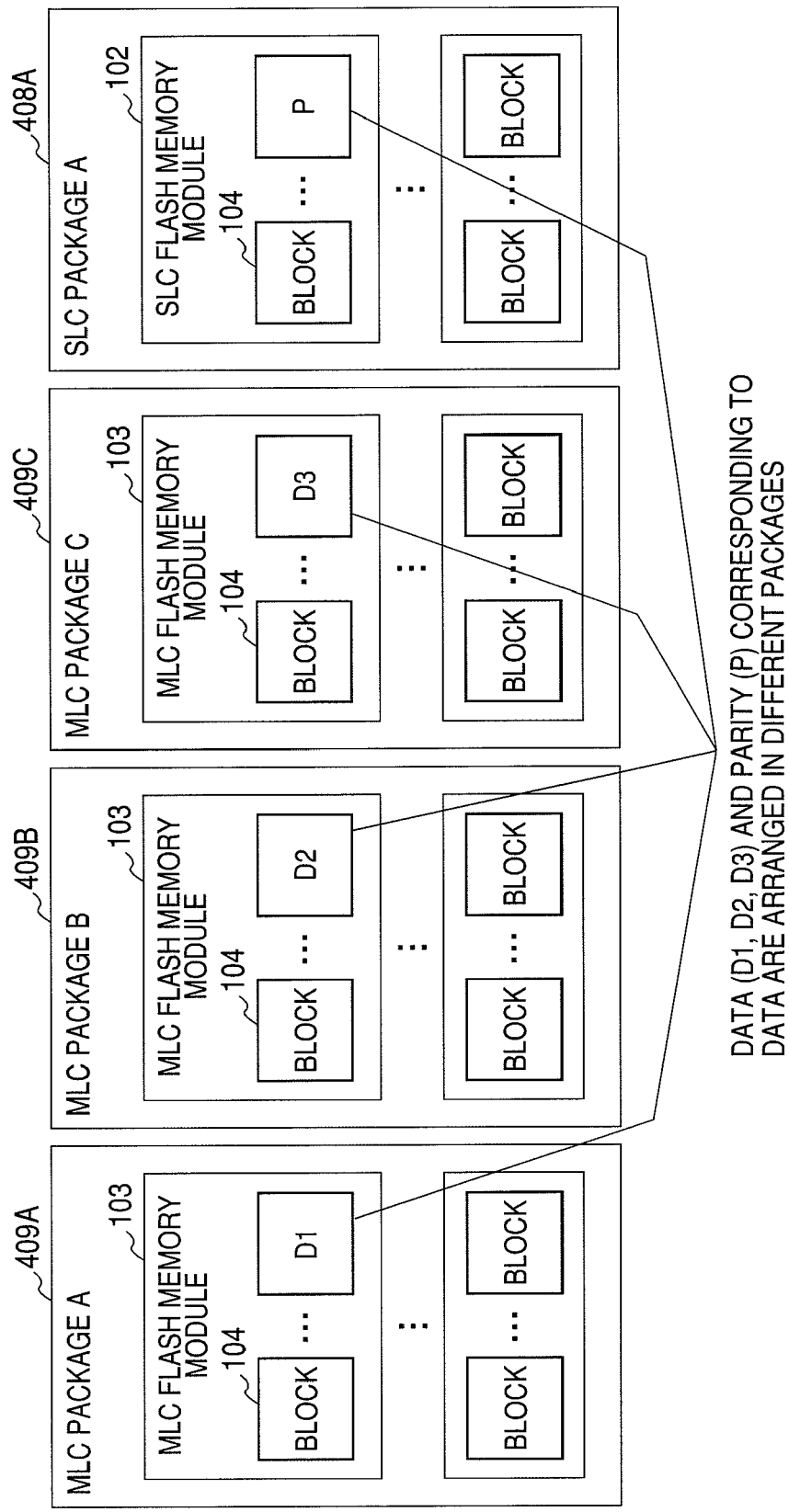
FIG. 10 is a diagram showing an example of a RAID group having flash memory packages in a storage system according to the second embodiment of the invention.

FIG. 10 is a diagram showing an example of a RAID group having flash memory packages in the storage system 400 according to the second embodiment of the invention.

FIG. 10 shows an example where a RAID4 having three data (D) and one parity (P) is constructed. In this case, as the type of the flash memory, one of an SLC and an MLC may be used, or an SLC and an MLC may be used together. Different RAID configuration, for example, RAID5, may be constructed.

According to the configuration shown in FIG. 10, MLC packages 409A to 409C are used as the flash memory packages, in which data is stored, and an SLC package 408A is used as a flash memory package, in which parity is stored. The parity is updated each time data stored in each flash memory package is updated, and thus an SLC having a long endurance is used.

When a RAID is formed by a plurality of SLC packages 408 or MLC packages 409, in order to secure redundancy, the substitute blocks are preferably allocated such that two or more of data or parities in the same RAID configuration are not included in one SLC package 408 or one MLC package 409 forming the RAID.

If the same data is stored in a block on a different flash memory package, RAID1 (mirroring) maybe constructed. In this case, the RAID1 may be formed by different SLC packages 408, different MLC packages 409, or an SLC package 408 and an MLC package 409.

In the flash memory, in addition to the endurance based on the erase count, an error may occur due to a physical failure, and data stored in a block may not be read. When a substitution processing of a block in which an error occurs is executed, data cannot be read from the block out of order. For this reason, in the above-described block substitution processing, the substitution processing may not be normally executed.

According to the second embodiment of the invention, data becomes redundant, and a RAID group can be constructed. For this reason, even though data stored in a block forming the RAID group is not read due to a physical failure, correction copy can be performed to restore data stored in the block out of order on the basis of data and parity forming the RAID group.

In the substitution processing by correction copy, in Steps 311 and 313, data stored in a failed block is restored by correction copy, and is stored in a substitute block. During the substitution processing by correction copy, in selecting the type of the substitute block, it is necessary to grasp a parameter, such as a rewrite frequency, before the block is out of order. Therefore, as the threshold value for determining the type of the substitute block, a rewrite frequency during a predetermined period is preferably used.

According to the second embodiment of the invention, in addition to the same advantages as the first embodiment, since data becomes redundant and is stored, data can be restored from an error due to a physical failure.

Third Embodiment

According to the second embodiment of the invention, the invention is applied to the storage system having flash memory packages, but according to a third embodiment, the invention is applied to a storage system having mounted thereon SSDs, not flash memory package. In the third embodiment, a storage controller controls SSDs.

Hereinafter, the third embodiment will be described with reference to FIGS. 11 to 14. In the third embodiment, the same contents as the first embodiment or the second embodiment will be appropriately omitted.

Figure 11:
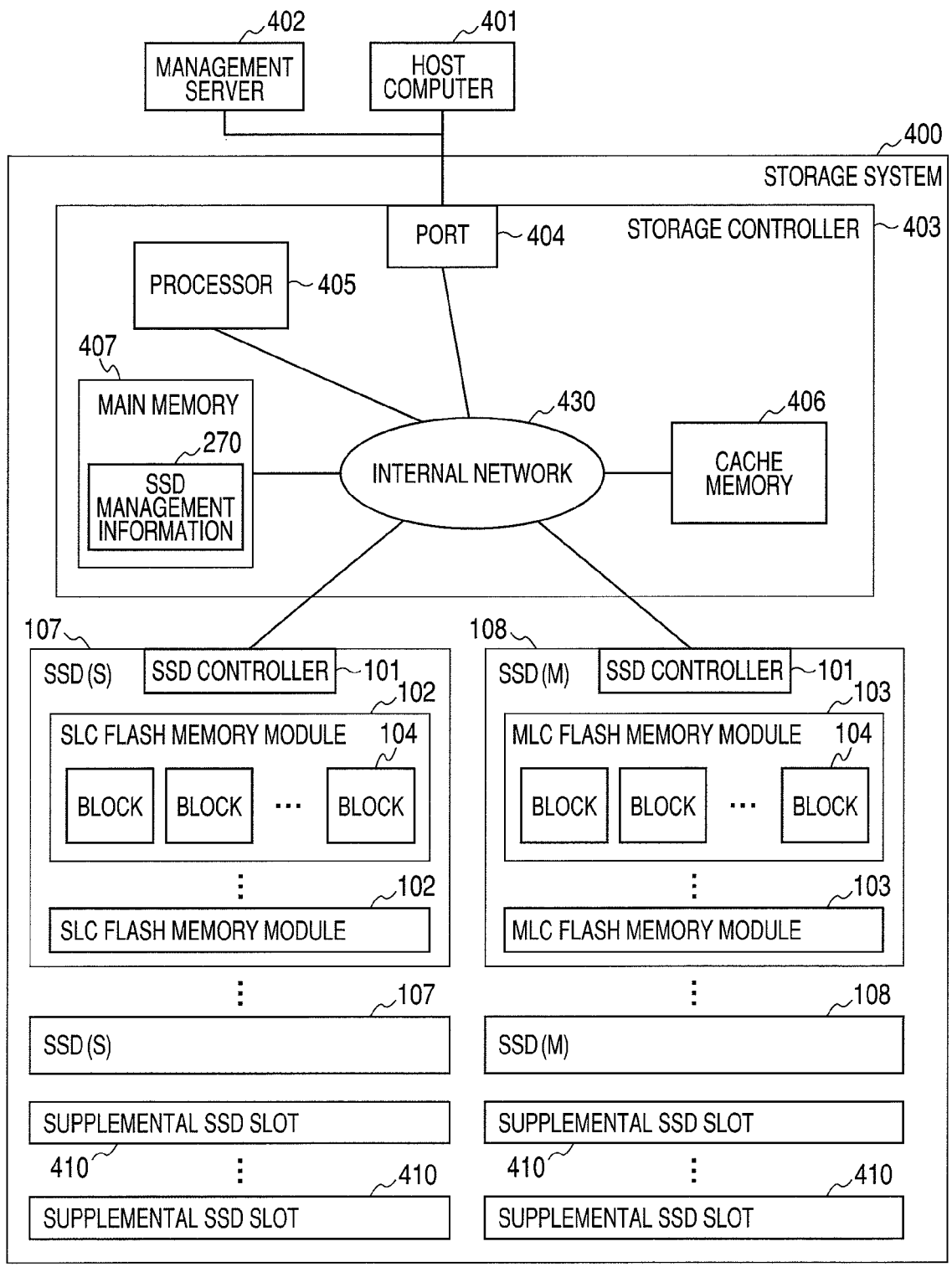
FIG. 11 is a block diagram showing an example of the configuration of a computer system according to a third embodiment of the invention.

FIG. 11 is a block diagram showing an example of the configuration of a computer system according to the third embodiment of the invention.

Similarly to the second embodiment, the computer system according to the third embodiment of the invention includes a storage system 400, a host computer 401, and a management server 402. The third embodiment has the storage system 400 different from the second embodiment.

The storage system 400 includes a storage controller 403 and a plurality of SSDs. The storage controller 403 controls the entire storage system 400. The plurality of SSDs include SSDs having an SLC (hereinafter, referred to as "SSD(S)") 107 and SSDs having an MLC (hereinafter, referred to as "SSD(M)") 108. The storage controller 403 is coupled to the SSD(S) 107 and the SSD(M) 108.

Similarly to the second embodiment, the storage controller 403 includes a port 404, a processor 405, a cache memory 406, and a main memory 407. The port 404, the processor 405, the cache memory 406, and the main memory 407 are coupled to each other through an internal network 430. The main memory 407 stores SSD management information 270 of the SSDs, instead of the block management information 250 in the second embodiment.

The SSD(S) 107 includes an SSD controller 101 and SLC flash memory modules 102. The SSD controller 101 has the same configuration as the SSD controller 101 of the SSD 100 shown in FIG. 1. The SSD(M) 108 includes MLC flash memory modules 103, instead of the SLC flash memory modules 102.

The storage system 400 has at least one supplemental SSD slot 411 which is used to add an SSD(S) 107 and an SSD(M) 108.

Figure 12:
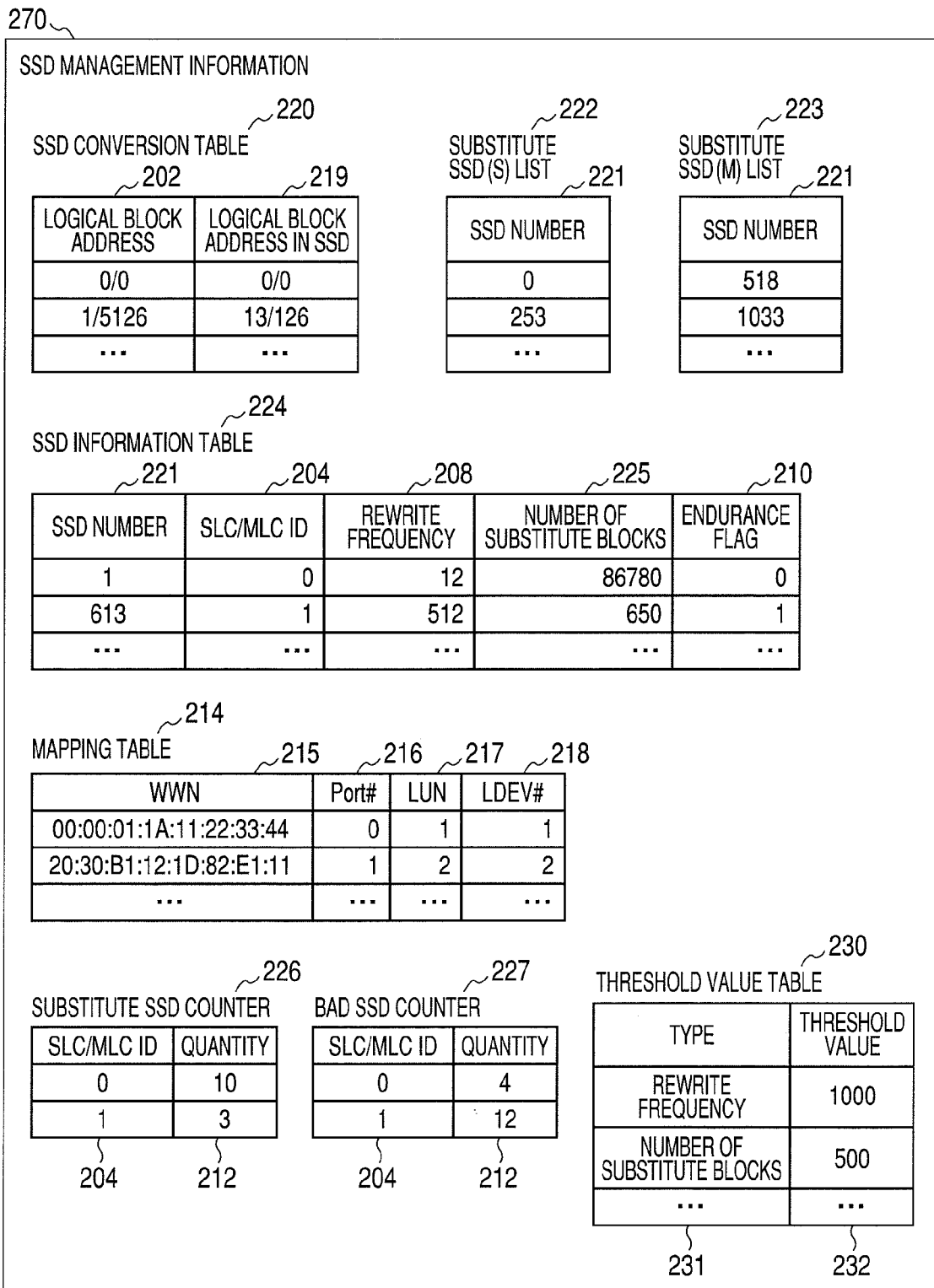
FIG. 12 is a diagram showing an example of SSD management information according to the third embodiment of the invention.

FIG. 12 is a diagram showing an example of SSD management information 270 according to the third embodiment of the invention.

The SSD management information 270 includes an SSD conversion table 220, a substitute SSD(S) list 222, a substitute SSD(M) list 223, an SSD information table 224, a substitute SSD counter 226, a bad SSD counter 227, a mapping table 214, and a threshold value table 230.

The SSD conversion table 220 includes a logical block address 202 and a logical block address 219 in an SSD. The logical block address 202 indicates the location of a block in a logical address space. The logical block address 219 in an SSD indicates the address of a block in a logical address space of an SSD allocated to the logical block address 202.

The storage system 400 cannot recognize the address of a physical block of an SSD in the storage system 400, but holds a logical block address in an SSD and associates the logical block address 202 and the logical block address 219 in the SSD by the SSD conversion table 220. The logical block address 219 in the SSD and the physical block address of the SSD are associated with each other in the SSD (SSD controller 101).

The substitute SSD(S) list 222 is a list of SSD(S) 107, to which no storage area is allocated but a storage area is allocatable, from among the SSDs in the storage system 400. SSD number 221 is a number for uniquely identifying an SSD coupled to the storage system 400.

The substitute SSD(M) list 223 is a list of SSD(M) 108, to which no storage area is allocated but a storage area is allocatable, from among the SSDs in the storage system 400.

The SSD information table 224 is a table which is used to manage information, such as a rewrite frequency, for each SSD in the storage system 400. The SSD information table 224 includes SSD number 221, SLC/MLC ID 204, rewrite frequency 208, number of substitute blocks 225, and endurance flag 210.

The SSD number 221 is a number for identifying an SSD in the storage system 400. The SLC/MLC ID 204 is information for identifying whether the type of a memory module in a corresponding SSD is SLC or MLC.

The rewrite frequency 208 is an indicator that, when a corresponding SSD becomes a worn-out SSD, determines whether or not to set the type of a substitute block to be allocated as a substitute to SSD(S) or SSD(M).

The number of substitute blocks 225 includes the number of substitute blocks of a memory module in a corresponding SSD. The endurance flag 210 is information indicating whether or not a corresponding SSD is a worn-out SSD. An SSD with the endurance flag 210 set to "1" becomes a worn-out SSD.

The mapping table 214 is the same as that in the second embodiment.

The substitute SSD counter 226 is a counter which manages the number of remaining substitute SSDs for each of the SSD(S) 107 and the SSD(M) 108. According to the third embodiment of the invention, substitution is performed in an SSD unit, and thus what is necessary is that the storage system 400 can acquire the number of SSDs to be substitutable.

The bad SSD counter 227 is a counter which manages the SSDs to be unusable due to worn-out or physical failures.

The threshold value table 230 has the same configuration as those in the first embodiment and the second embodiment, but since the SSDs are managed by the storage controller 403, the threshold values to be set are different from those in the first and second embodiments.

When an SSD is added to the storage system 400, corresponding information in the SSD management information 270 is updated. Specifically, when an SSD(S) 107 is added to the storage system 400, the SSD number 221 of the added SSD(S) 107 is added to the substitute SSD(S) list 222. The quantity 212 of the substitute SSD counter 226 corresponding to the SLC/MLC ID 204 is increased by the number of added SSD(S) 107. Similarly, when an SSD(M) 108 is added to the storage system 400, the SSD number 221 of the added SSD (M) 108 is added to the substitute SSD(M) list 222, and the quantity 212 of the substitute SSD counter 226 corresponding to the SLC/MLC ID 204 is increased by the number of added SSD(M) 108.

Figure 13:
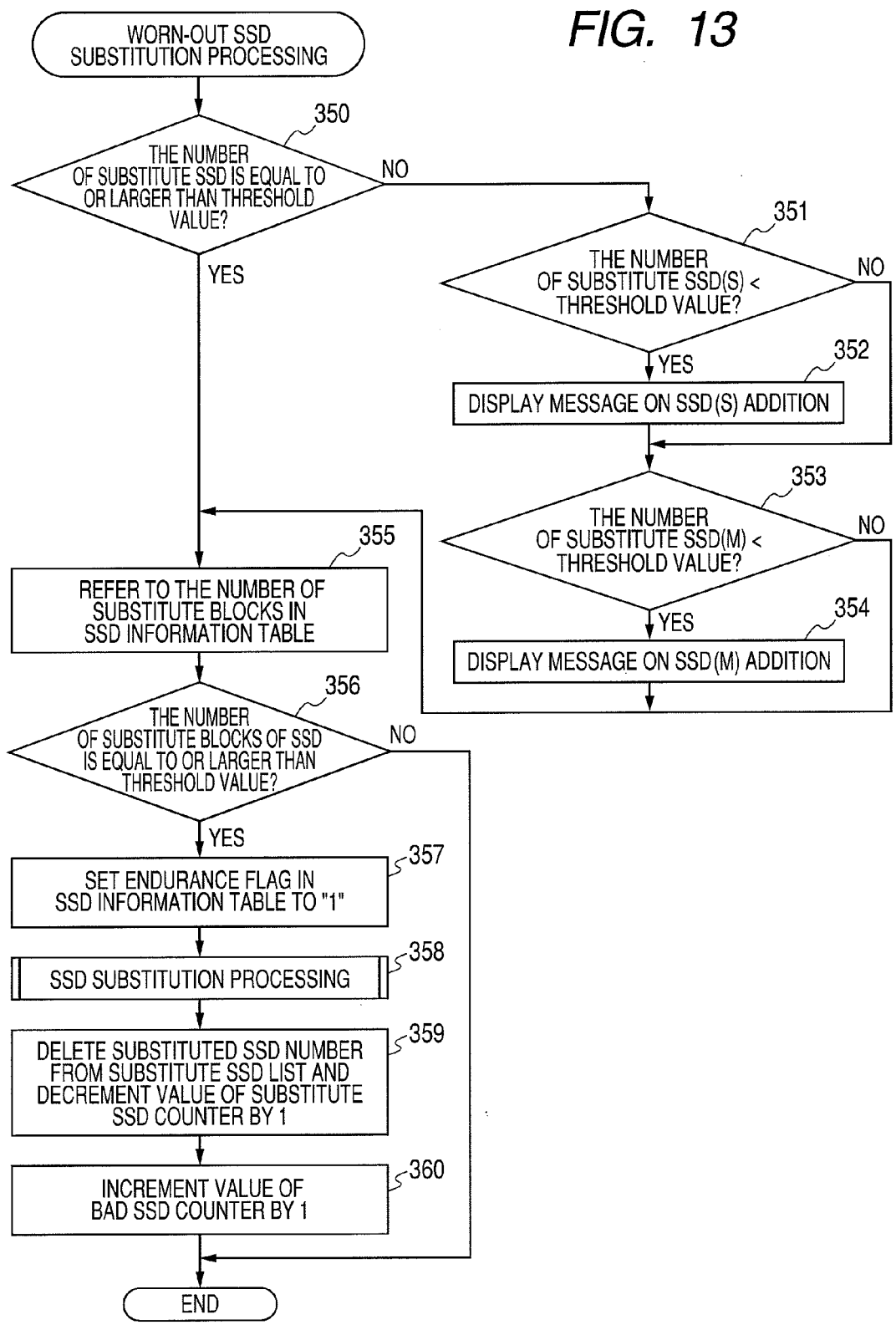
FIG. 13 is a flowchart showing an example of a substitution processing procedure of a worn-out SSD according to the third embodiment of the invention.

FIG. 13 is a flowchart showing a substitution processing procedure of a worn-out SSD according to the third embodiment of the invention.

In FIG. 13, although this processing is executed when a substitute block allocation processing is executed in the SSD, but this processing may be executed regularly.

The processor 405 of the storage controller 403 refers to the substitute SSD counter 226, and determines whether or not the quantity 212 of the substitute SSDs is equal to or larger than a prescribed threshold value (Step 350). Here, the threshold value is preferably set such that the substitute SSD(S) 107 and the substitute SSD(M) 108 remain. The threshold value needs to be set in advance, but the set threshold value may be changed on the basis of the status of the system.

When the quantity 212 of the substitute SSDs is smaller than the prescribed threshold value ("No" in Step 350), since a substitute SSD cannot be allocated in a short time, the processor 405 of the storage controller 403 displays a message to urge addition of an SSD(S) 107 or an SSD(M) 108.

The processor 405 of the storage controller 403 first determines whether or not the number of substitute SSDs of the SSD(S) 107 is smaller than a threshold value (Step 351).

When the number of substitute SSDs of the SSD(S) 107 is smaller than the threshold value ("Yes" in Step 351), a message to urge addition of an SSD(S) 107 is displayed (Step 352).

Next, the processor 405 of the storage controller 403 determines whether or not the number of substitute SSDs of the SSD(M) 108 is smaller than a threshold value (Step 353). When the number of substitute SSDs of the SSD(M) 108 is smaller than the threshold value ("Yes" in Step 353), a message to urge addition of an SSD(M) 108 is displayed (Step 354).

The threshold values used in Steps 351 and 353 may be the same value or may be set depending on the type of the memory module mounted on the SSD.

When the number of substitute SSDs is equal to or larger than the threshold value ("Yes" in Step 350), or after a message is displayed, the processor 405 of the storage controller 403 determines whether or not the SSD is a worn-out SSD.

The processor 405 of the storage controller 403 refers to the number of substitute blocks 225 in the SSD information table 224 (Step 355), and in order to determine whether or not an SSD to be processed is a worn-out SSD, determines whether or not the number of substitute blocks 225 is equal to or larger than the threshold value (Step 356). In the third embodiment, in order to determine whether or not an SSD is worn out, the number of substitute blocks 225 which can be acquired from the SSD information table 224 is used, but for example, when information having an effect on the endurance, such as an erase count, can be separately acquired from the SSD, the acquirable information may be used to determine whether or not an SSD is a worn-out SSD.

When the number of substitute blocks 225 is smaller than the threshold value ("No" in Step 356), the processor 405 of the storage controller 403 ends the SSD substitution processing.

When the number of substitute blocks 225 is equal to or larger than the threshold value ("Yes" in Step 356), the processor 405 of the storage controller 403 sets the endurance flag 210 in the SSD information table 224 to "1" (ON) (Step 357). Next, a processing (SSD substitution processing) for allocating a substitute SSD is executed (Step 358). The details of the SSD substitution processing will be described below with reference to FIG. 14.

If the substitute SSD is allocated, the processor 405 of the storage controller 403 deletes the SSD number 221 of the substituted SSD from the substitute SSD(S) list 222 or the substitute SSD(M) list 223, and decrements the substitute SSD counter by 1 (Step 359).

The processor 405 of the storage controller 403 increments the quantity 212 of the bad SSD counter 227 corresponding to the SLC/MLC ID 204 of the worn-out SSD by 1 (Step 360).

Figure 14:
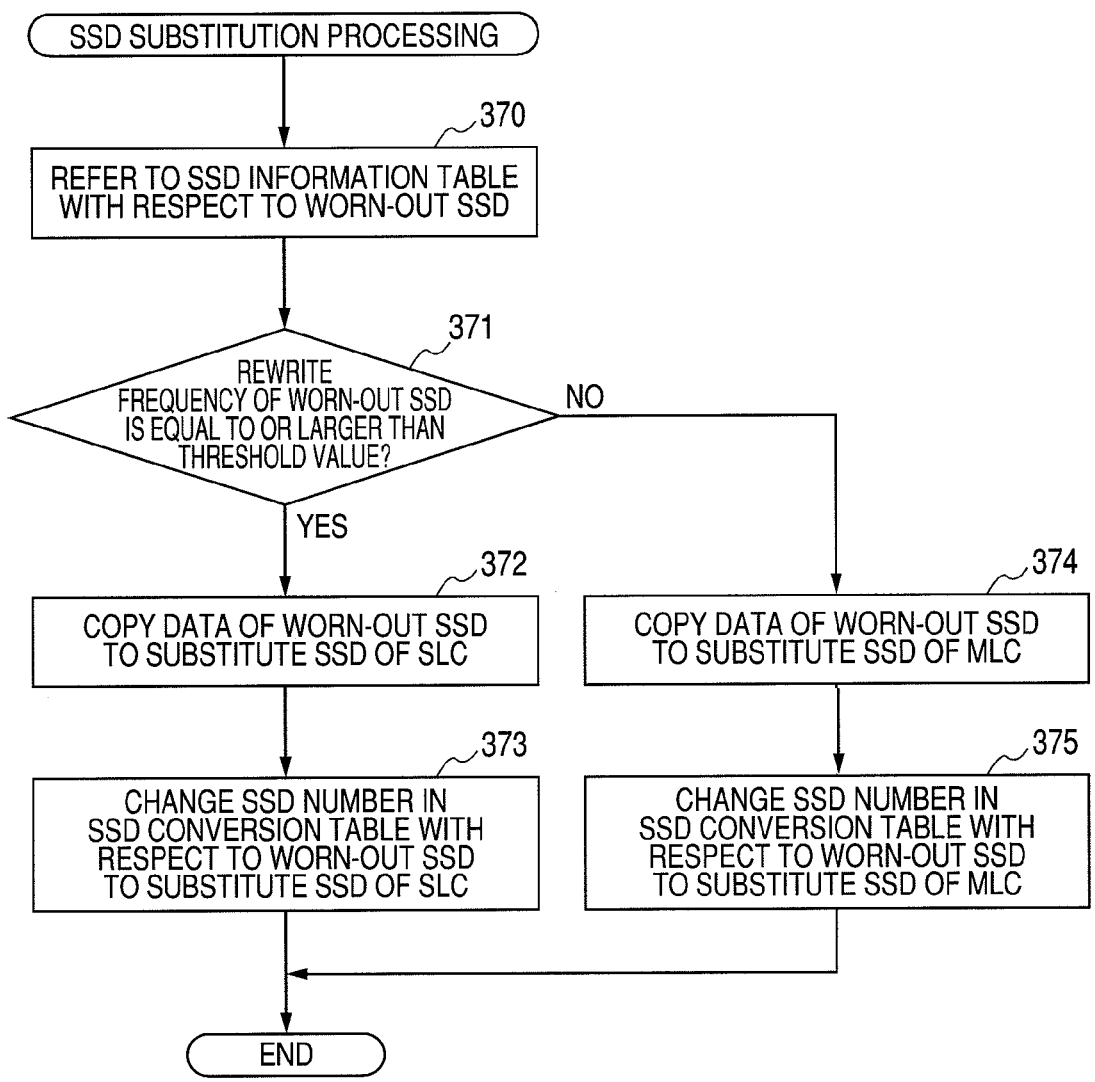
FIG. 14 is a flowchart showing an example of an SSD substitution processing procedure according to the third embodiment of the invention.

FIG. 14 is a flowchart showing an example of an SSD substitution processing procedure according to the third embodiment of the invention.

The processor 405 of the storage controller 403 refers to the rewrite frequency 208 in the SSD information table 224 with respect to the worn-out SSD (Step 370), and determines whether or not the rewrite frequency 208 is equal to or larger than a threshold value (Step 371).

When the rewrite frequency 208 of the worn-out SSD is equal to or larger than the threshold value ("Yes" in Step 371), since an SSD(S) 107 is allocated as a substitute SSD, the processor 405 of the storage controller 403 copies data stored in the worn-out SSD to the substitute SSD(S) 107 (Step 372).

The processor 405 of the storage controller 403 changes the SSD number 221 corresponding to the worn-out SSD in the SSD conversion table 220 to the SSD number 221 of the substitute SSD(S) 107 (Step 373).

When the rewrite frequency 208 of the worn-out SSD is smaller than the threshold value ("No" in Step 371), since an SSD(M) 108 is allocated as a substitute SSD, the processor 405 of the storage controller 403 copies data stored in the worn-out SSD to the substitute SSD(M) 108 (Step 374).

The processor 405 of the storage controller 403 changes the SSD number 221 corresponding to the worn-out SSD in the SSD conversion table 220 to the SSD number 221 of the substitute SSD(M) 108 (Step 375).

In the above-described processing, for all the SSDs, the number of substitute blocks 225 is compared with the threshold value (Step 356), but since this processing is executed when the substitute block allocation processing is executed in the SSD, it is not necessary to execute all the SSDs each time the processing is executed. For example, in regard to an SSD which is subjected to the substitute block allocation processing, the above-described processing may be executed when the number of substitute blocks 225 becomes smaller than the threshold value.

In the third embodiment, similarly to the second embodiment, in order to increase reliability as the storage system, a RAID group can be constructed. For example, if data (D) and parity (P) corresponding to data are arranged in the blocks of different SSDs, RAID4 or RAID5 may be constructed. In this case, in regard to the type of the SSD in which data and parity are arranged, an SLC or an MLC may be used, or an SLC and an MLC may be used together. If the same data is stored in different SSDs, RAID1 may be constructed. For example, RAID1 may be constructed by different SSD(S) 107, SSD (M) 108, or SSD(S) 107 and SSD(M) 108 in pairs. In the third embodiment, if the RAID group is constructed, the substitution processing by correction copy as described with reference to the second embodiment may be executed.

In the third embodiment, when a RAID group is constructed, as a substitute SSD, an unused SSD may be selected, or an SSD in a different RAID group may be selected. A preliminary SSD may be provided for each RAID group, and the preliminary SSD may be selected as a substitute SSD. In addition, a preliminary SSD may be provided for a plurality of RAID groups. In this case, when an SSD has to be substituted in a RAID group from among the plurality of RAID groups, the preliminary SSD may be selected as a substitute SSD.

In the third embodiment, a case in which an SSD using an SLC and an SSD using an MLC are used together has been described, but in a case in which an SSD having an SLC and an MLC is used, the same substitution processing may be used by adding an SSD having an SLC or an SSD having an MLC.

Even though the storage system manages the SSDs and the flash memory packages together, if the storage system has an addition slot for a flash memory package and an SSD addition slot, when an SSD is substituted, the third embodiment may be applied, and when a flash memory package is substituted, the second embodiment may be applied.

According to the third embodiment of the invention, the type of the substitute SSD may be selected on the basis of a parameter having an effect on the endurance of the flash memory, such as a rewrite frequency. Specifically, if the type of a substitute SSD as a substitute for an SSD having a high rewrite frequency is SLC, the endurance of the storage system can be extended. In addition, if the type of a substitute SSD as a substitute for an SSD having a low rewrite frequency is MLC, bit cost can be reduced.

Fourth Embodiment

In the first to third embodiments of the invention, if a block is erased, the processing is still continuing while the block is not substituted until the block is worn out. In the fourth embodiment, each time a block is erased, a substitute block is selected and allocated. The erased block is reused as a substitute block insofar as it becomes a worn-out block.

The fourth embodiment of the invention may be applied to the first to third embodiments. Hereinafter, an example where the fourth embodiment is applied to the SSD 100 in the first embodiment will be described with reference to FIG. 15.

Figure 15:
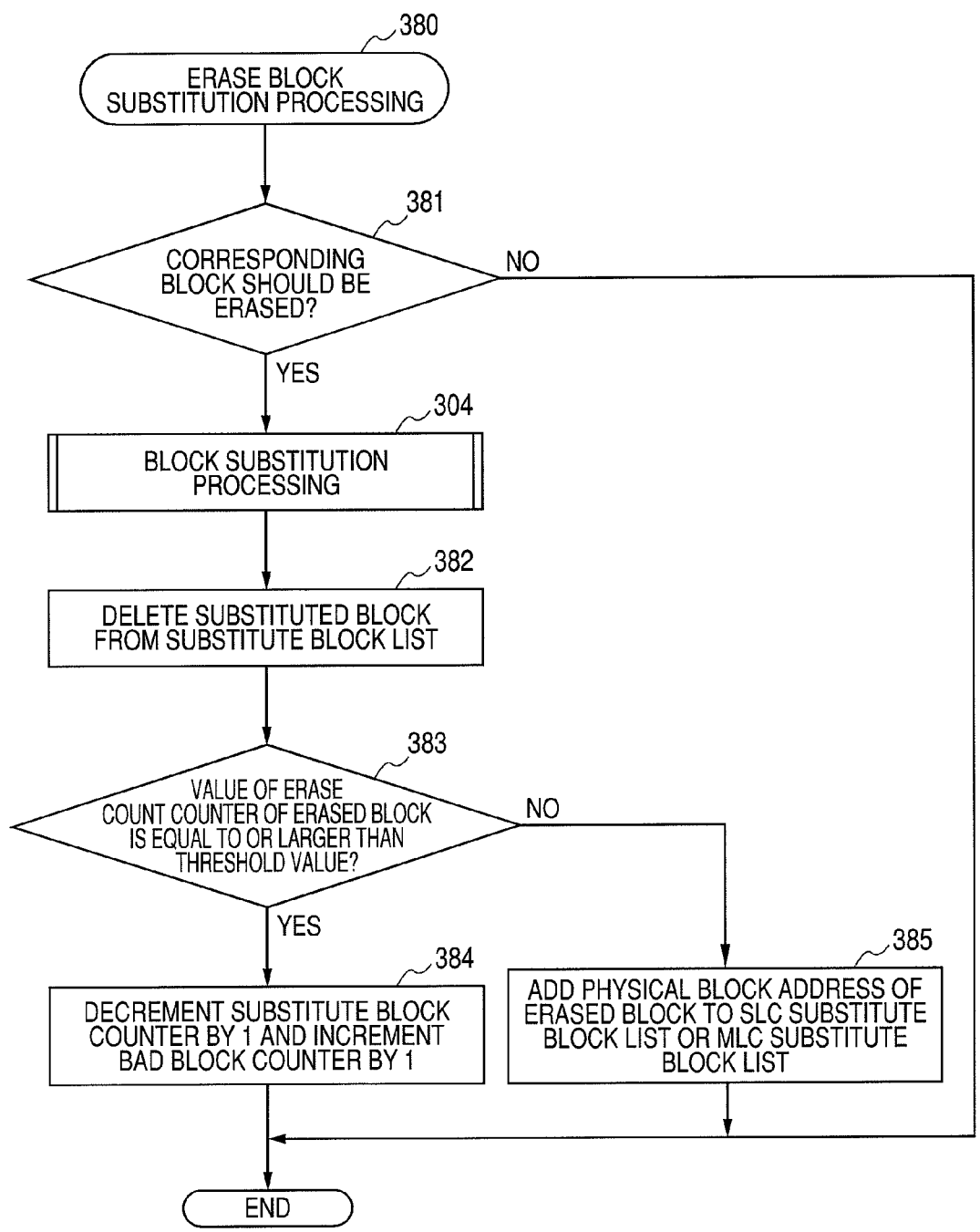
FIG. 15 is a flowchart showing an example of an erase block substitution processing procedure according to a fourth embodiment of the invention.

FIG. 15 is a flowchart showing an example of an erase block substitution processing procedure according to the fourth embodiment of the invention.

If a write request is received, the processor 105 of the SSD controller 101 determines whether or not a write data storage destination block has to be erased (Step 381). When the storage destination block does not have to be erased ("No" in Step 381), the erase block substitution processing ends, and the writing processing is resumed.

When the write data storage destination block has to be erased ("Yes" in Step 381), the processor 105 of the SSD controller 101 executes the block substitution processing in Step 304 of FIG. 4.

In the fourth embodiment, as described above, each time a block is erased, a storage destination is moved to a substitute block, and the erased block is reused as a substitute block. In this case, for each substitute block, the erase count is recorded. Therefore, after the type of the substitute block is selected, a substitute block having a small erase count may be preferentially allocated. If a substitute block having a small erase count is preferentially allocated, the erase count is leveled for each block, and thus the endurance of the SSD 100 can be extended. Moreover, since an erase count for a predetermined period cannot be acquired as an indicator which is used to determine the type of the substitute block, a time elapsed from previous erasure may be used.

The processor 105 of the SSD controller 101 deletes the physical block address 203 of the substituted block from the SLC substitute block list 205 or the MLC substitute block list 206 (Step 382).

The processor 105 of the SSD controller 101 refers to the block information table 207, and determines whether or not the value of the erase count counter 209 of the erased block is equal to or larger than a threshold value (Step 383).

When the value of the erase count counter 209 of the erased block is equal to or larger than the threshold value ("Yes" in Step 383), the processor 105 of the SSD controller 101 can determine that the erased block is a worn-out block. Next, the processor 105 of the SSD controller 101 decrements the quantity 212 of the substitute block counter by 1, and increments the quantity 212 of the bad block counter by 1 (Step 384).

When the value of the erase count counter 209 of the erased block does not exceed the threshold value ("No" in Step 383), since the erased block can be reused as a substitute block, the processor 105 of the SSD controller 101 registers the physical address of the erased block in the SLC substitute block list 205 or the MLC substitute block list 206 (Step 385).

In the block substitution processing according to the first to third embodiments of the invention, when a block is worn out, a block is substituted. In the fourth embodiment, however, the block substitution processing is executed each time a block is erased.

Therefore, according to the fourth embodiment of the invention, the block substitution processing can be finely executed. As a result, the endurance of the SSD or the storage system can be extended.

What is claimed is:

1. A storage apparatus comprising:
a semiconductor storage media that has a plurality of storage devices; and
a controller that is coupled to the semiconductor storage media,
wherein each of the storage devices has an upper limit of an erase count of data stored therein,
the plurality of storage devices include a first storage device and a second storage device having an upper limit smaller than that of the first storage device,
the controller includes an interface, a processor that is coupled to the interface, and a memory that is coupled to the processor,
the memory stores storage media management information that is used to manage the semiconductor storage media,
the storage media management information includes area conversion information including the correspondence of a first address to be specified as a storage destination of data and a second address of an area where data is stored, and a rewrite frequency of stored data is recorded for each area, and
the controller selects an area corresponding to the first address, acquires the rewrite frequency of the selected area from the storage media management information, determines whether or not the acquired rewrite frequency is equal to or larger than a first threshold value, when the acquired rewrite frequency is equal to or larger than the first threshold value, selects a first area to be provided by the first storage device, when the acquired rewrite frequency is smaller than the first threshold value, selects a second area to be provided by the second storage device, and sets a second address of the selected first area or second area to the second address corresponding to the first address, to thereby update the area conversion information.

2. The storage apparatus according to claim 1,
wherein, when a data write request is received, the controller selects an area corresponding to a first address in the data write request.

3. The storage apparatus according to claim 1,
wherein the controller periodically selects an area corresponding to the first address.

4. The storage apparatus according to claim 1,
wherein the storage media management information records the erase count of data stored in the semiconductor storage media for each area, and
the controller acquires the erase count of the selected area from the storage media management information, and when the acquired erase count is equal to or larger than a second threshold value, for the selected area, determines whether or not the acquire rewrite frequency is equal to or larger than the first threshold value.

5. The storage apparatus according to claim 1,
wherein the storage media management information is data rewritable, and includes a substitute area list having a list of areas not corresponding to the first address,
the erase count of data stored in the semiconductor storage media is recorded for each area, and
the controller selects the first area or the second area from the substitute area list, acquires the erase count of the selected area from the storage media management information, and when the acquired erase count is smaller than a second threshold value, adds the selected area to the substitute area list.

6. The storage apparatus according to claim 1,
wherein the rewrite frequency is the number of erase count of data for a predetermined period.

7. The storage apparatus according to claim 1,
wherein the rewrite frequency is set on the basis of a time at which data stored in a corresponding area is last erased when the corresponding rewrite frequency is acquired from the storage media management information.

8. The storage apparatus according to claim 1,
wherein the storage devices are flash memory chips,
the semiconductor storage media is a flash memory module having the flash memory chips, and
the storage apparatus is a flash memory drive which is coupled to a computer through the interface.

9. The storage apparatus according to claim 1,
wherein the storage devices are flash memory chips,
the semiconductor storage media is a flash memory module having the flash memory chips, and
the storage apparatus is a storage system from and to which data is read and written by a host computer.

10. The storage apparatus according to claim 1,
wherein the storage devices are flash memory chips,
the semiconductor storage media is a flash memory drive including a flash memory module having the flash memory chips, and
the storage apparatus is a storage system from and to which data is read and written by a host computer.

11. A method of managing a data storage area in a storage apparatus,
wherein the storage apparatus includes a semiconductor storage media that has a plurality of storage devices, and a controller that is coupled to the semiconductor storage media,
each of the storage devices has an upper limit of an erase count of data stored therein,
the plurality of storage devices include a first storage device and a second storage device having an upper limit smaller than that of the first storage device,
the controller includes an interface, a processor that is coupled to the interface, and a memory that is coupled to the processor,
the memory stores storage media management information that is used to manage the semiconductor storage media,
the storage media management information includes area conversion information including the correspondence of a first address to be specified as a storage destination of data and a second address of an area where data is stored, and a rewrite frequency of stored data is recorded for each area, and
the method comprising:
causing the controller to select an area corresponding to the first address;
causing the controller to acquire the rewrite frequency of the selected area from the storage media management information;
causing the controller to determine whether the acquired rewrite frequency is equal to or larger than a first threshold value;

when the acquired rewrite frequency is equal to or larger than the first threshold value, causing the controller to select a first area to be provided by the first storage device;

when the acquired rewrite frequency is smaller than the first threshold value, causing the controller to select a second area to be provided by the second storage device; and causing the controller to set a second address of the selected first area or second area to the second address corresponding to the first address, to thereby update the area conversion information.

12. The method according to claim 11, further comprising:

when a data write request is received, causing the controller to select an area corresponding to a first address in the data write request.

13. The method according to claim 11, wherein the storage media management information records the erase count of data stored in the semiconductor storage media for each area, and the method further comprising:

causing the controller to acquire the erase count of the selected area from the storage media management information; and when the acquired erase count is equal to or larger than a second threshold value, causing the controller to, for the selected area, determine whether or not the acquired rewrite frequency is equal to or larger than the first threshold value.

14. The method according to claim 11, wherein the storage media management information is data rewritable, and includes a substitute area list having a list of areas not corresponding to the first address, the erase count of data stored in the semiconductor storage media is recorded for each area, and the method further comprising:

causing the controller to select the first area or the second area from the substitute area list;

causing the controller to acquire the erase count of the selected area from the storage media management information; and when the acquired erase count is smaller than a second threshold value, causing the controller to add the selected area to the substitute area list.

15. A storage apparatus comprising:

a flash memory module that has a plurality of flash memory chips; and a controller that is coupled to the flash memory module, wherein each of the flash memory chips has an upper limit of an erase count of data stored therein, the plurality of flash memory chips include a first flash memory chip and a second flash memory chip having an upper limit smaller than that of the first flash memory chip, the flash memory chips are managed in a block unit of a predetermined size, the controller includes an interface, a processor that is coupled to the interface, and a memory that is coupled to the processor, the memory stores block management information which is use to manage the blocks, the block management information includes block conversion information including correspondence of a logical address to be specified as a data storage destination and a physical address which is a physical address of a block, in which data is stored, and a substitute block list which is data rewritable and has a list of blocks not corresponding to the logical address, a rewrite frequency which is an erase count of data in each block for a predetermined period, and an erase count of data stored in the corresponding block are recorded, and when a data write request with respect to the flash memory module is received, the controller specifies the physical address corresponding to the logical address in the data write request on the basis of the block conversion information, to thereby specify a block in which requested data is written, acquires a rewrite frequency of the specified block from the storage media management information, determines whether or not the acquired rewrite frequency is equal to or larger than a first threshold value, when the acquired rewrite frequency is equal to or larger than the first threshold value, selects a first block in the first flash memory chip from the substitute block list and writes requested data in the selected first block, when the acquired rewrite frequency is smaller than the first threshold value, selects a second block in the second flash memory chip from the substitute block list and writes requested data in the selected second block, and after requested data is written, sets the physical address of the block, in which requested data is written, to the physical address corresponding to the logical address in the data write request, to thereby update the block conversion information.

\* \* \* \* \*